(12) United States Patent
Tani et al.

(10) Patent No.: US 10,192,710 B2
(45) Date of Patent: Jan. 29, 2019

(54) ION MILLING APPARATUS AND ION MILLING METHOD

(71) Applicant: Hitachi High-Technologies Corporation, Minato-ku, Tokyo (JP)

(72) Inventors: Yuki Tani, Tokyo (JP); Hisayuki Takasu, Tokyo (JP); Shuichi Takeuchi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/574,873

(22) PCT Filed: May 25, 2015

(86) PCT No.: PCT/JP2015/064884
§ 371 (c)(1),
(2) Date: Nov. 17, 2017

(87) PCT Pub. No.: WO2016/189614
PCT Pub. Date: Dec. 1, 2016

(65) Prior Publication Data
US 2018/0130630 A1    May 10, 2018

(51) Int. Cl.
*H01J 37/305*    (2006.01)
*H01J 37/08*    (2006.01)
(Continued)

(52) U.S. Cl.
CPC .............. *H01J 27/04* (2013.01); *H01J 37/08* (2013.01); *H01J 37/243* (2013.01); *H01J 37/30* (2013.01);
(Continued)

(58) Field of Classification Search
USPC ..... 250/492.2, 492.3, 492.21, 307, 309, 310
See application file for complete search history.

(56) References Cited

U.S. PATENT DOCUMENTS 6,211,527 B1 *  4/2001  Chandler ............ H01J 37/3056
                                                            250/492.2
6,268,608 B1 *  7/2001  Chandler ............ H01J 37/3056
                                                            250/492.2
(Continued)

FOREIGN PATENT DOCUMENTS

JP    62-180944 A    8/1987
JP     3-205740 A    9/1991
(Continued)

OTHER PUBLICATIONS

International Search Report (PCT/ISA/210) issued in PCT Application No. PCT/JP2015/064884 dated Jul. 14, 2015 with English translation (6 pages).
(Continued)

*Primary Examiner* — Bernard Souw
(74) *Attorney, Agent, or Firm* — Crowell & Moring LLP

(57) ABSTRACT

An object of the present invention is to provide an ion milling apparatus capable of processing deposits attached to an ion gun and an ion milling method capable of processing deposits attached to an ion gun. The ion milling apparatus includes gas injection means for injecting a gas toward the ion gun, and the gas injection means included in the ion milling apparatus moves the deposits attached to the ion gun by injecting the gas toward the inside of the ion gun.

21 Claims, 14 Drawing Sheets

(51) Int. Cl.
*H01J 27/04* (2006.01)
*H01J 37/30* (2006.01)
*H01J 37/24* (2006.01)
*H01J 37/302* (2006.01)

(52) U.S. Cl.
CPC .......... *H01J 37/302* (2013.01); *H01J 37/305* (2013.01); *H01J 2237/08* (2013.01)

(56) References Cited

U.S. PATENT DOCUMENTS

| | | | |
|---|---|---|---|
| 2005/0016338 A1* | 1/2005 | Gerdes | B23B 5/02 82/112 |
| 2005/0016838 A1 | 1/2005 | Murata et al. | |
| 2011/0259366 A1* | 10/2011 | Sweeney | C23C 14/48 134/10 |
| 2014/0042653 A1 | 2/2014 | Ueno | |

FOREIGN PATENT DOCUMENTS

| | | | |
|---|---|---|---|
| JP | 6-290723 A | 10/1994 | |
| JP | 2004-363050 A | 12/2004 | |
| JP | 2014-89968 A | 5/2014 | |
| JP | 2014-235948 A | 12/2014 | |

OTHER PUBLICATIONS

Japanese-language Written Opinion (PCT/ISA/237) issued in PCT Application No. PCT/JP2015/064884 dated Jul. 14, 2015 (4 pages).
Japanese-language Office Action issued in counterpart Japanese Application No. 2017-520089 dated Sep. 25, 2018 with unverified English translation (five pages).

\* cited by examiner

[Fig. 1]
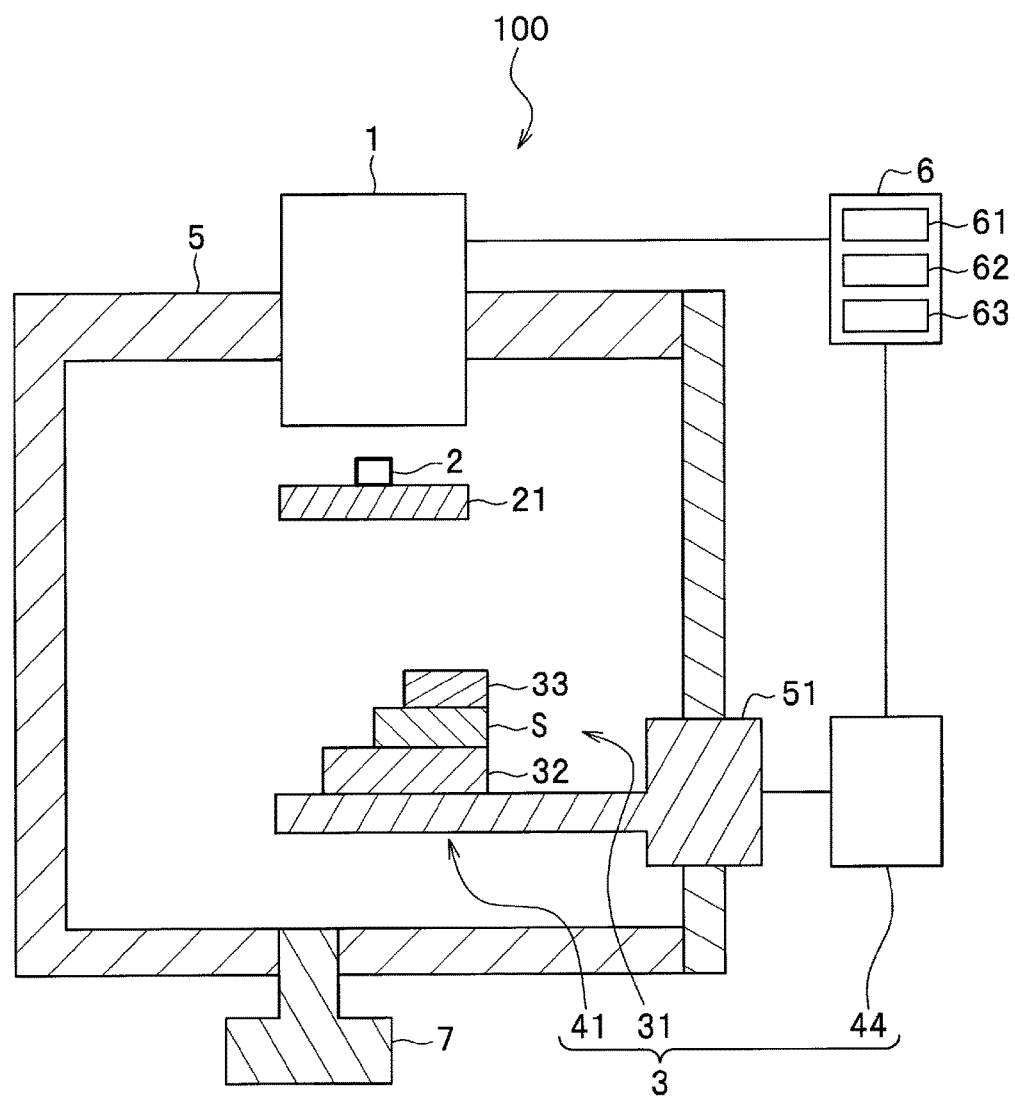

[Fig. 2]
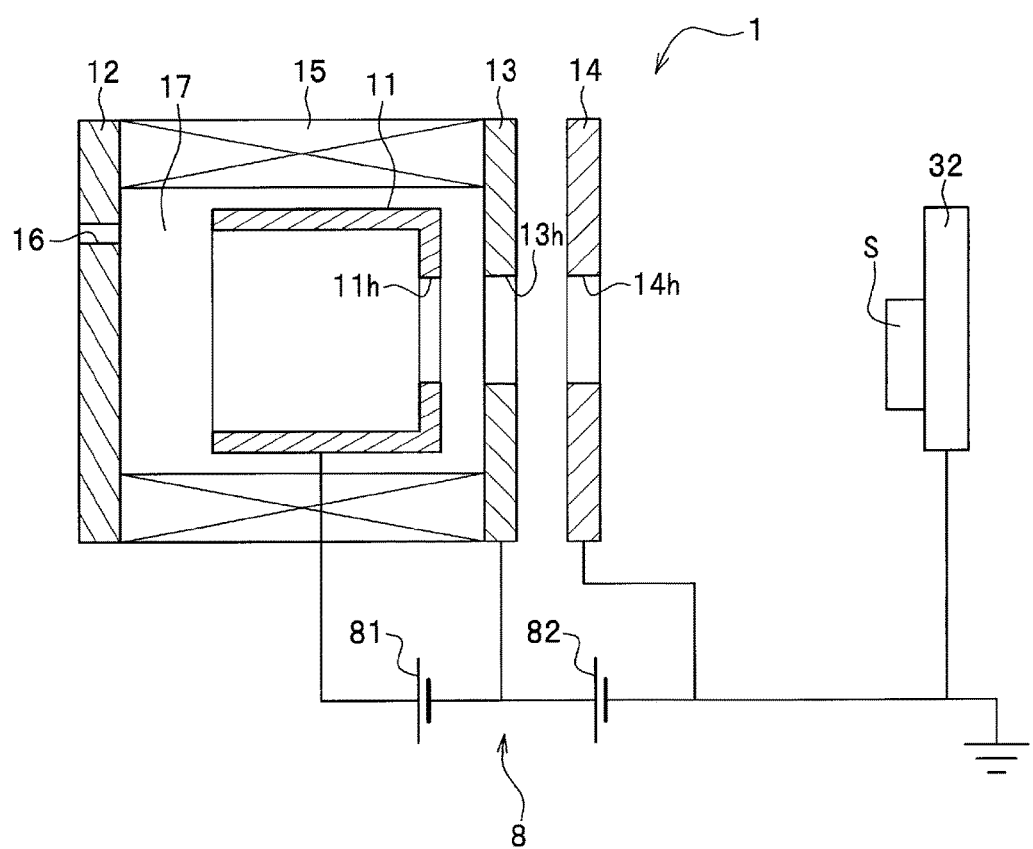

[Fig. 3]
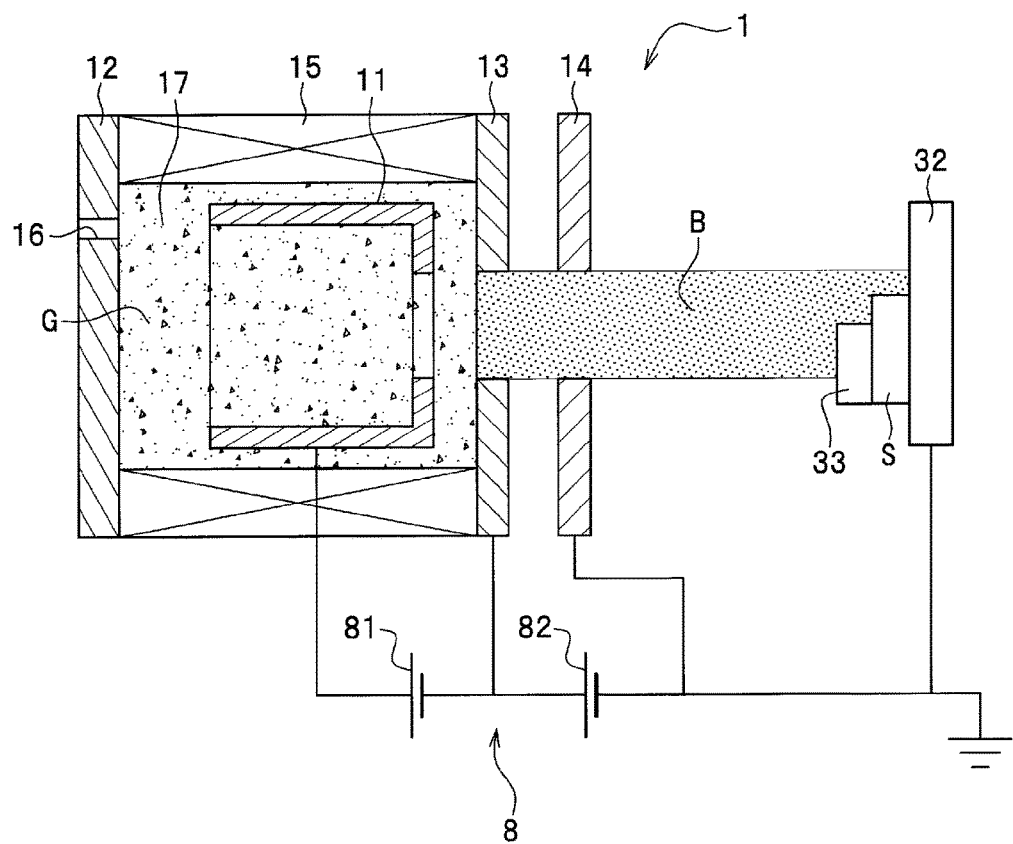

[Fig. 4A]
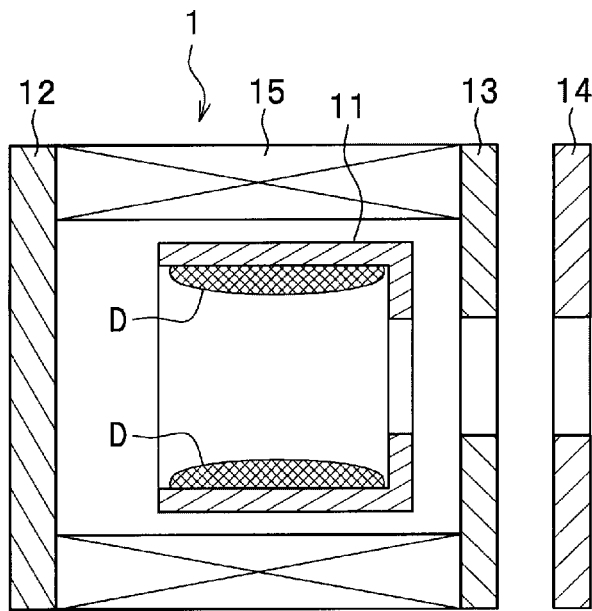
[Fig. 4B]
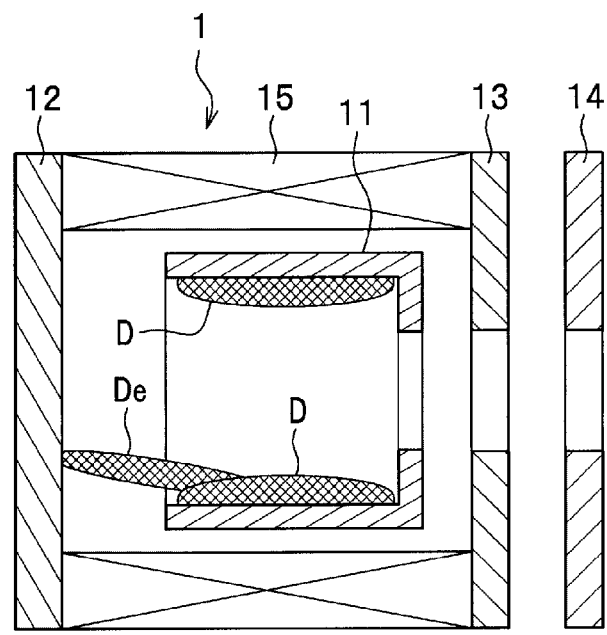

[Fig. 5A]
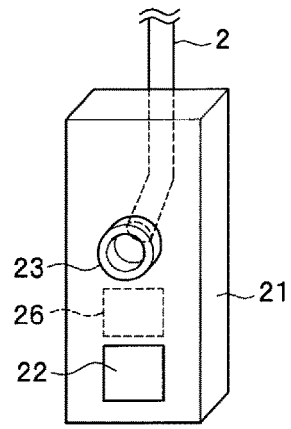
[Fig. 5B]
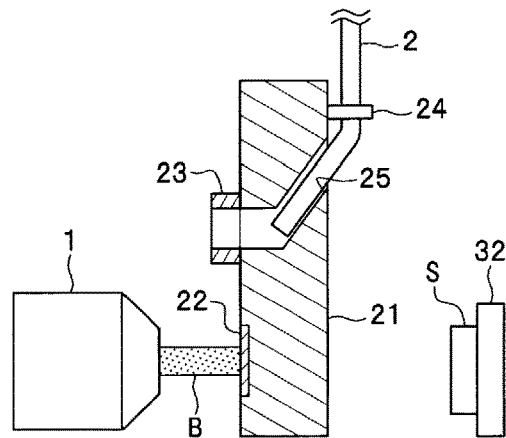
[Fig. 5C]
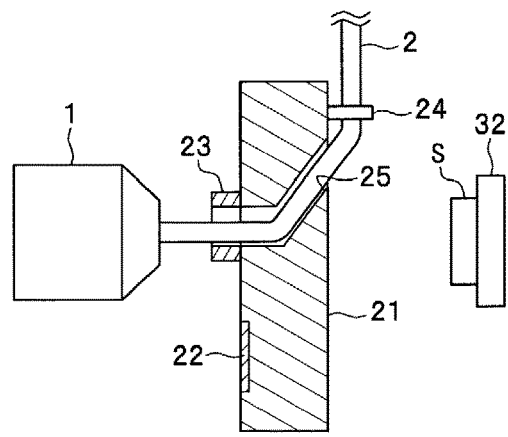

[Fig. 6]
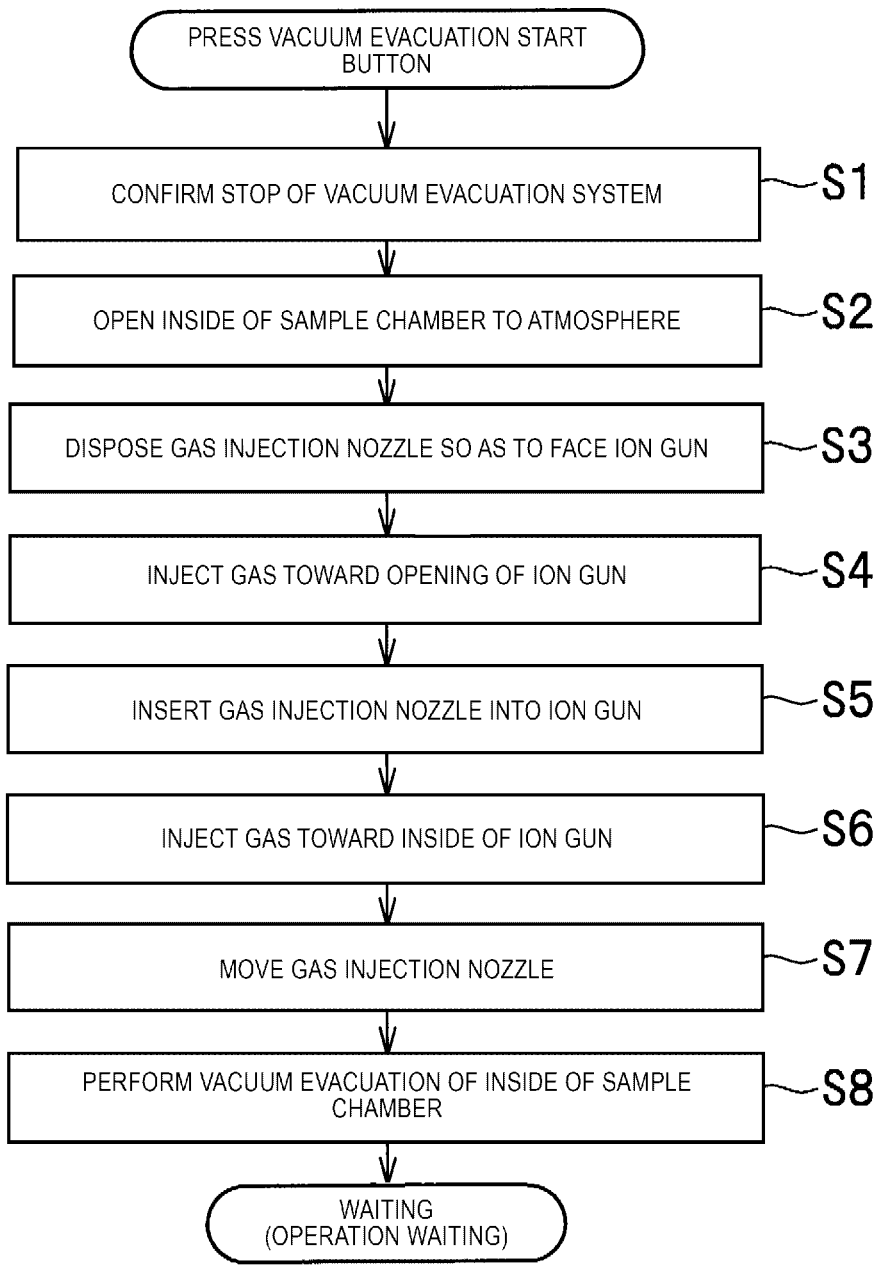

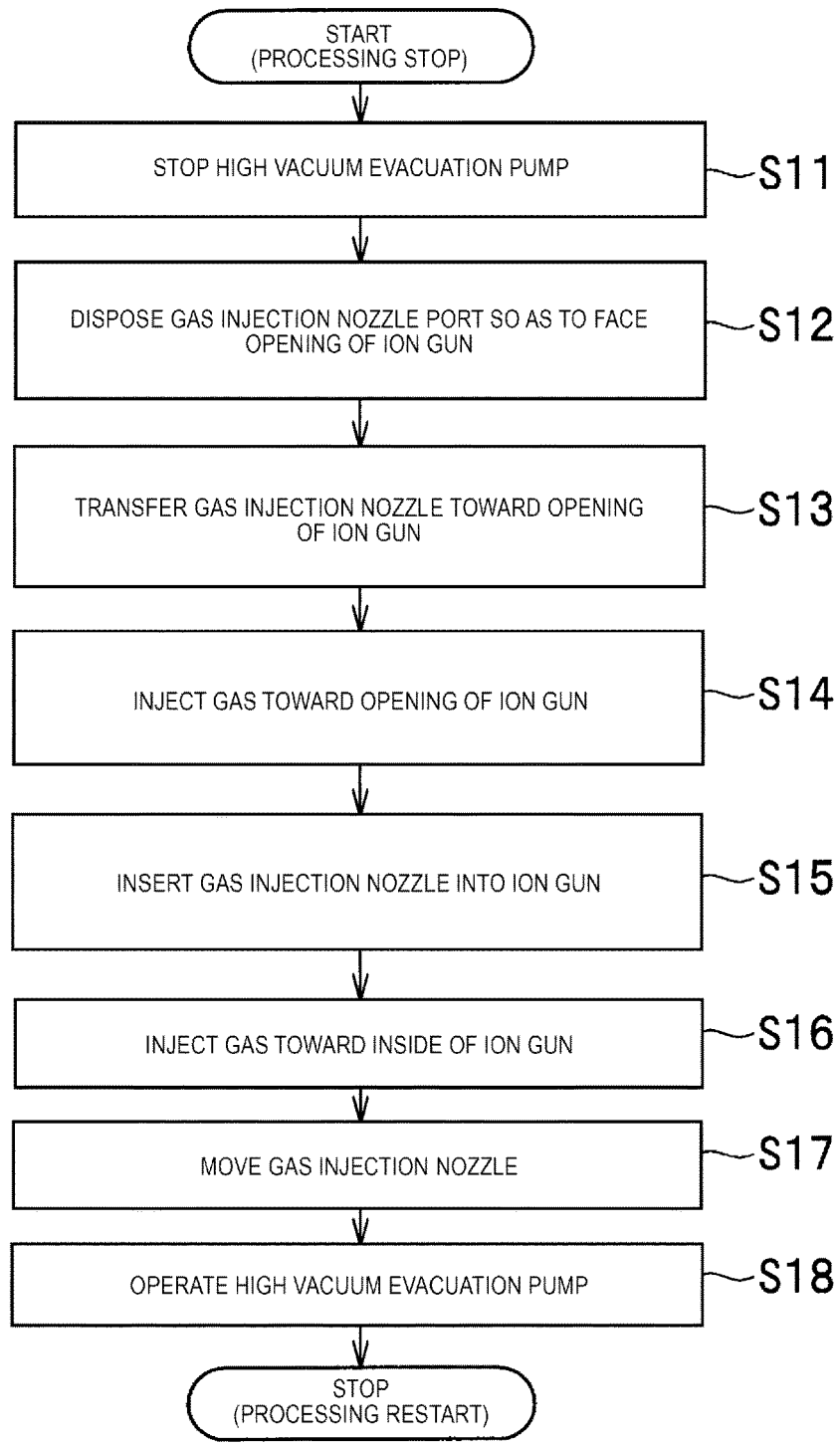
[Fig. 7]

[Fig. 8A]
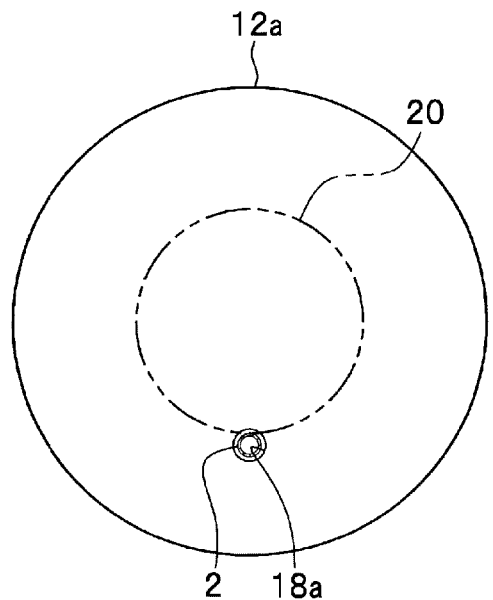
[Fig. 8B]
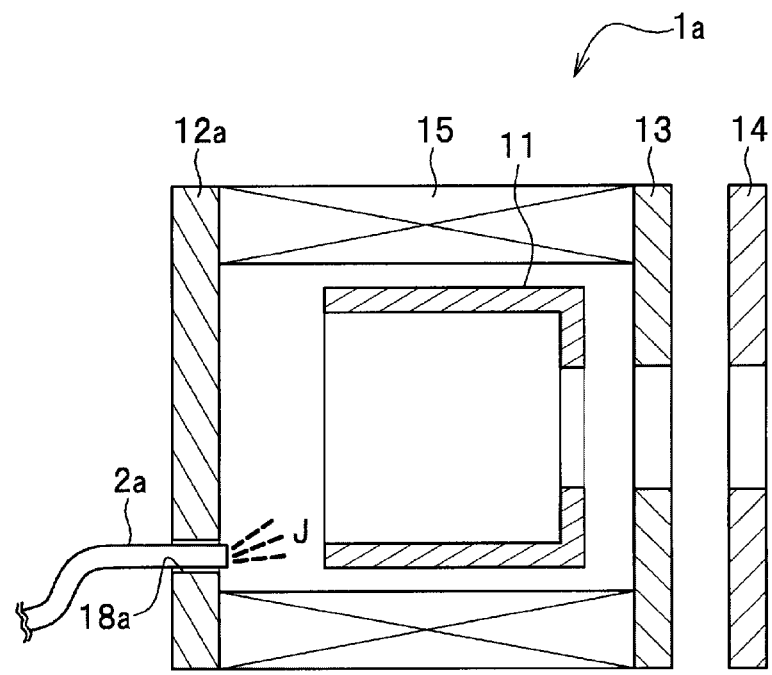

[Fig. 9]
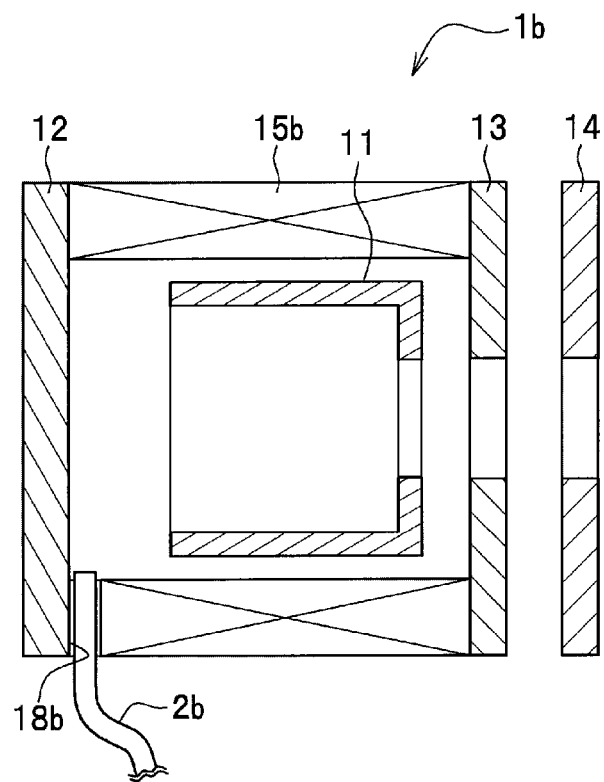

[Fig. 10A]
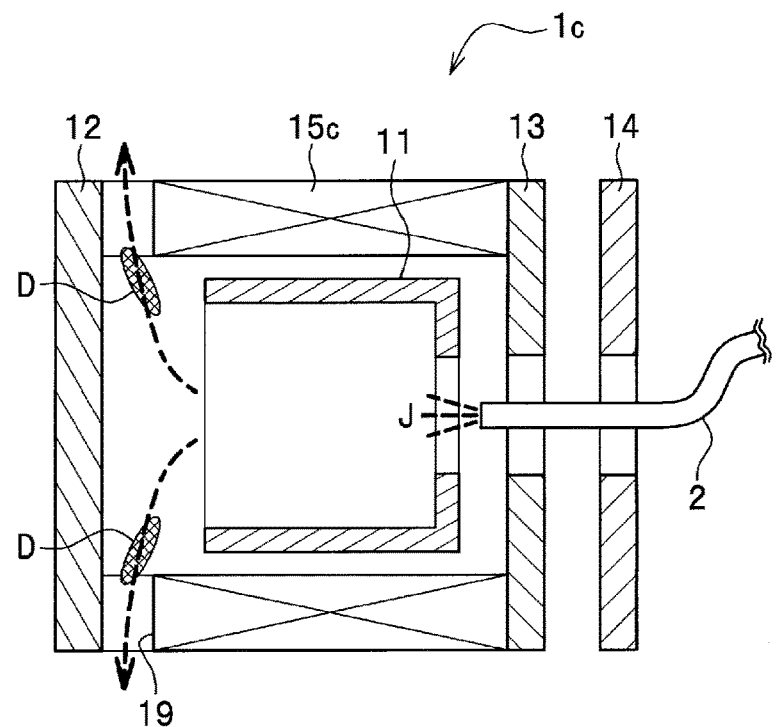
[Fig. 10B]
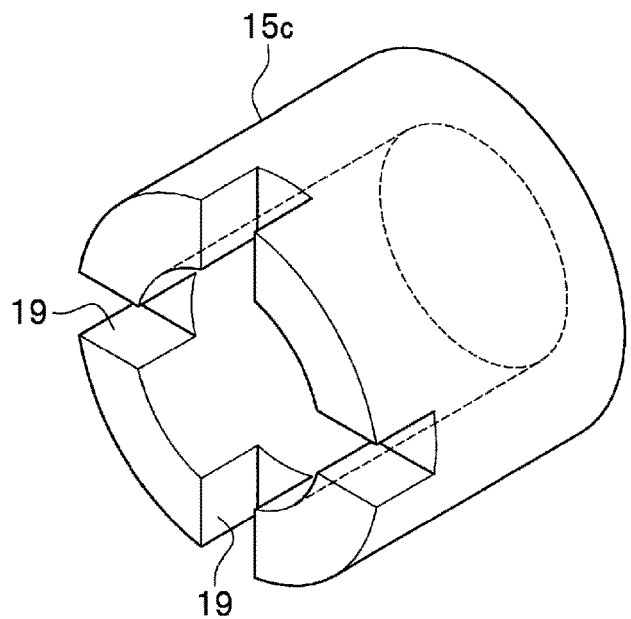

[Fig. 11A]
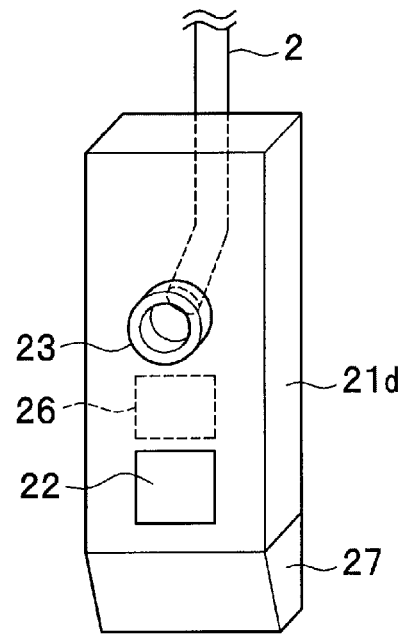
[Fig. 11B]
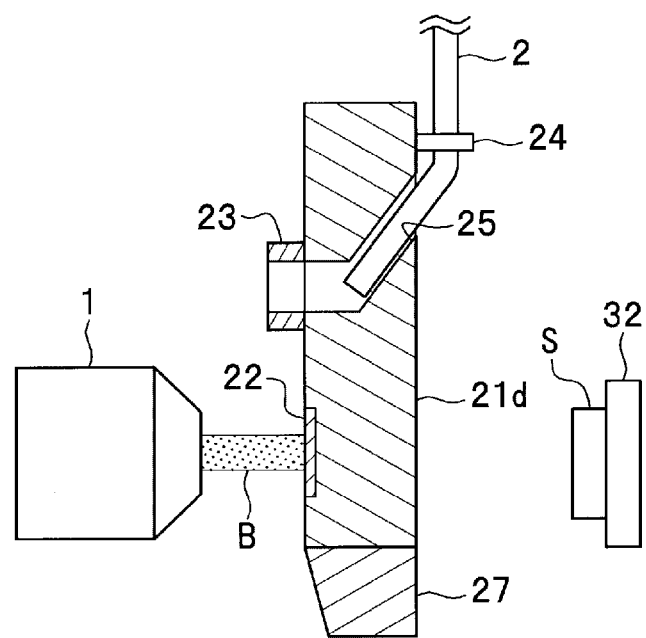

[Fig. 11C]
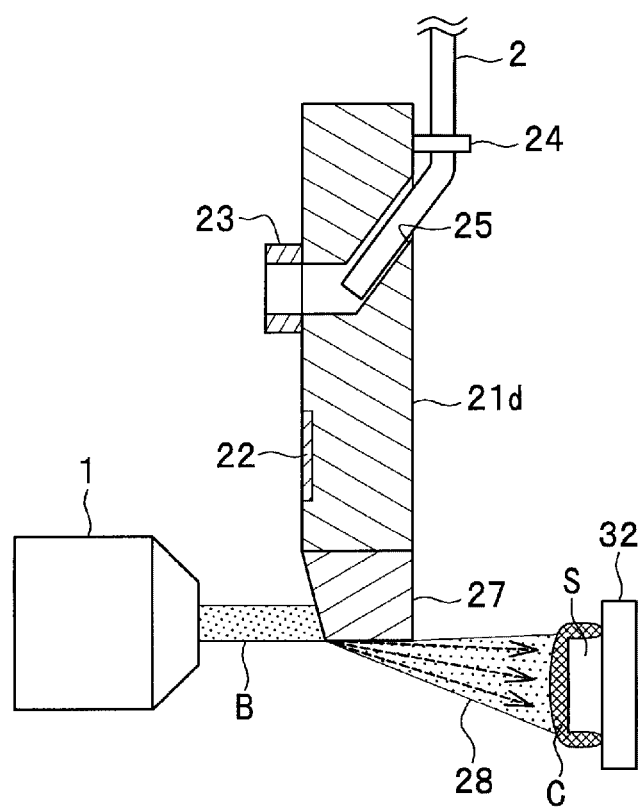

[Fig. 12]
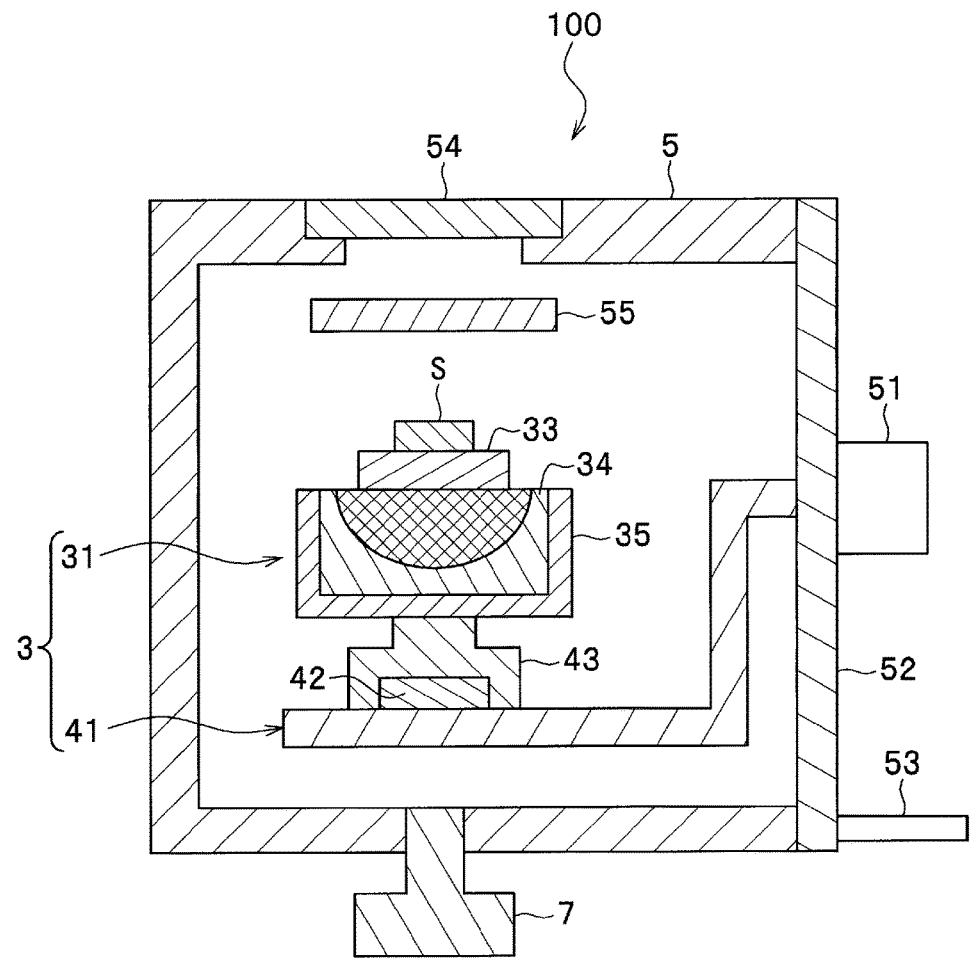

[Fig. 13]
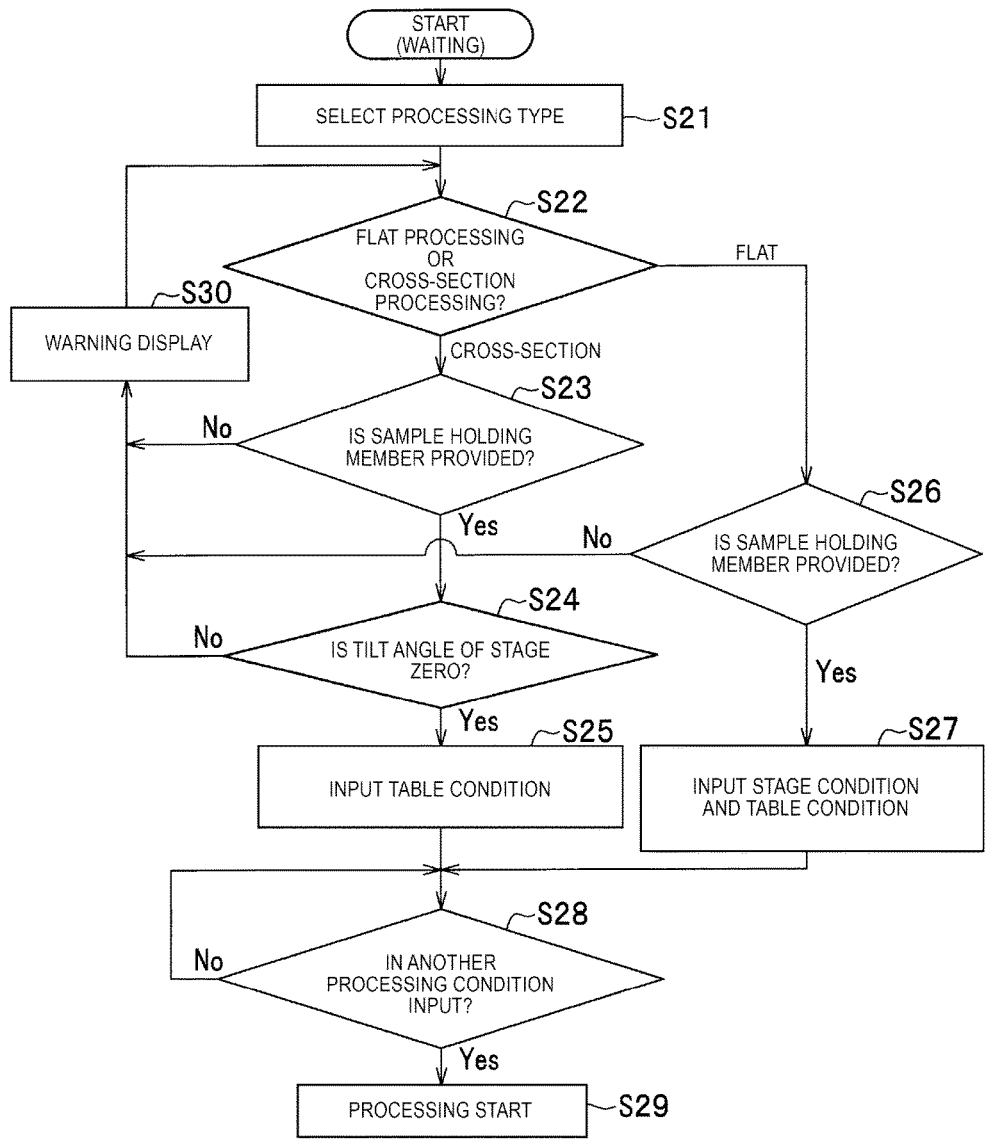

ION MILLING APPARATUS AND ION MILLING METHOD

TECHNICAL FIELD

The present invention relates to an ion milling apparatus and an ion milling method.

BACKGROUND ART

An ion milling method is known as one of methods for preparing a section of a sample for a purpose of analyzing by a scanning electron microscope.

An ion milling apparatus which performs the ion milling method is configured to include a sample chamber, an ion gun, a sample stage, a vacuum evacuation mechanism, and the like.

Examples of the ion gun which can be applied to the ion milling apparatus include, for example, a Penning-discharge-type ion gun. In PTL 1, an ion gun is disclosed for a purpose of decreasing an amount of sputtered particles which are deposited on an anode. The ion gun includes a first chamber, and an ion generation unit which generates ions by ionization of a gas in the first chamber. The ion generation unit includes an anode which is provided in the first chamber, a first cathode which is provided so as to face the first chamber and emits electrons, a gas supply unit which supplies a gas to the first chamber, and a magnetic field generation unit which generates a magnetic field in the first chamber. The electrons emitted by the first cathode are turned by the magnetic field generated by the magnetic field generation unit, and the turned electrons come into collision with the gas supplied by the gas supply unit, thereby generating the ions in the first chamber. An ion source with irregularities is provided in a first region of the front surface of the first cathode that faces the first chamber.

CITATION LIST

Patent Literature

PTL 1: JP-A-2014-235948

SUMMARY OF INVENTION

Technical Problem

As a result of intensive studies focusing on deposits attached to components of the ion gun, inventors of this application have reached the following findings.

In the Penning-discharge-type ion gun disclosed in PTL 1, the components of the ion gun such as a cathode and an acceleration electrode are also irradiated with the ions generated in an ionization chamber. For this reason, a phenomenon in which sputtered particles are discharged from the components of the ion gun and are attached to other components (hereinafter, appropriately referred to as redeposition), occurs in the inside of the ion gun.

The deposits attached to the components of the ion gun by the redeposition cause discharging unstability or discharge stop of the ion gun due to abnormal discharge or a short circuit.

In the invention described in PTL 1, since abnormal discharge does not occur in the inside of the ion gun as an ion source, a normal operation can be performed over a long period of time.

However, the invention described in PTL 1 does not consider processing of the deposits.

An object of the present invention is to provide an ion milling apparatus capable of processing deposits attached to an ion gun and an ion milling method capable of processing deposits attached to an ion gun.

Solution to Problem

The present invention relates to provide an ion milling apparatus including gas injection means for injecting a gas toward an ion gun. In addition, the present invention relates to provide an ion milling method including causing gas injection means included in an ion milling apparatus to move attachments attached to an ion gun by injecting a gas toward the ion gun.

Advantageous Effects of Invention

According to the present invention, it is possible to provide an ion milling apparatus capable of processing deposits attached to an ion gun and an ion milling method capable of processing deposits attached to an ion gun.

Problems, configurations, and effects other than those described above will be described in the specification.

BRIEF DESCRIPTION OF DRAWINGS

FIG. 1 is a schematic diagram illustrating a configuration of an ion milling apparatus according to a first embodiment of the present invention.

FIG. 2 is a schematic diagram illustrating a configuration around an ion gun of the ion milling apparatus according to the first embodiment of the present invention.

FIG. 3 is a schematic diagram illustrating a state where an ion beam is emitted from the ion gun of the ion milling apparatus according to the first embodiment of the present invention.

FIG. 4A is a schematic diagram illustrating a state where deposits are attached to a front surface of an anode of the ion milling apparatus according to the first embodiment of the present invention.

FIG. 4B is a schematic diagram illustrating a state where the anode and a cathode are short-circuited by the deposits attached to the front surface of the anode of the ion milling apparatus according to the first embodiment of the present invention.

FIG. 5A is a schematic diagram illustrating a beam current detection plate provided with a nozzle insertion mechanism according to the first embodiment of the present invention.

FIG. 5B is a schematic diagram illustrating a support state of a gas injection nozzle and beam current detection by the beam current detection plate provided with the nozzle insertion mechanism according to the first embodiment of the present invention.

FIG. 5C is a schematic diagram illustrating a state in which the gas injection nozzle is inserted into the ion gun by the nozzle insertion mechanism provided in the beam current detection plate according to the first embodiment of the present invention.

FIG. 6 is a flowchart illustrating a procedure of deposit processing when supplying power according to the first embodiment of the present invention.

FIG. 7 is a flowchart illustrating a procedure of the deposit processing according to the first embodiment of the present invention.

FIG. 8A is a schematic diagram illustrating the cathode of the ion gun in which a gas injection nozzle insertion port according to a second embodiment of the present invention is provided in the cathode.

FIG. 8B is a schematic sectional diagram illustrating the ion gun in which the gas injection nozzle insertion port according to the second embodiment of the present invention is provided in the cathode.

FIG. 9 is a schematic sectional diagram illustrating the ion gun in which the gas injection nozzle insertion port according to a third embodiment of the present invention is provided in a magnet.

FIG. 10A is a schematic diagram illustrating the ion gun in which a discharge port is provided in the magnet according to a fourth embodiment of the present invention.

FIG. 10B is a schematic diagram illustrating the magnet of the ion gun according to the fourth embodiment of the present invention.

FIG. 11A is a schematic diagram illustrating the beam current detection plate provided with a conductive target and the nozzle insertion mechanism according to a fifth embodiment of the present invention.

FIG. 11B is a schematic diagram illustrating beam current detection by the beam current detection plate provided with the conductive target and the nozzle insertion mechanism according to the fifth embodiment of the present invention.

FIG. 11C is a schematic diagram illustrating a state where sputtering is performed by diffusing the ion beam by the conductive target and the nozzle insertion mechanism provided in the beam current detection plate according to the fifth embodiment of the present invention.

FIG. 12 is a schematic diagram illustrating a configuration of the ion milling apparatus according to a sixth embodiment of the present invention.

FIG. 13 is a flowchart illustrating a setting order of a processing type and a processing condition according to a seventh embodiment of the present invention.

DESCRIPTION OF EMBODIMENTS

Hereinafter, embodiments for carrying out the present invention (hereinafter, referred to as "embodiments") will be described in detail with reference to the accompanying drawings as appropriate.

First Embodiment

FIG. 1 is a schematic diagram illustrating a configuration of an ion milling apparatus 100 according to the present embodiment.

The ion milling apparatus 100 according to the present embodiment includes an ion gun 1, a gas injection nozzle 2, a sample holding system 3, a sample chamber 5, a control system 6, a vacuum evacuation system 7, a power supply system 8 (refer to FIG. 2), a beam current detection plate 21, a sample holding member driving unit 44, and a sample stage 51. The ion gun 1 and the gas injection nozzle 2 may be present at a side of the sample chamber 5, that is, at a front side of the paper surface.

The ion gun 1 is an ion source that generates ions inside the ion gun 1 and emits the generated ions toward the sample S held by the sample holding system 3. Components which are required to generate the ions are disposed inside the ion gun 1. The sample S is irradiated with an ion beam B (refer to FIG. 3) made of the ions emitted from the ion gun 1, and is processed (refer to FIG. 3).

The sample holding system 3 is configured to include a sample holding member 31, a sample holding member installation portion 41, and the sample holding member driving unit 44.

The sample holding member 31 is a member for holding the sample S by any means. The sample holding member installation portion 41 is configured such that the sample holding member 31 is provided and can be drawn out of the sample chamber 5 when the sample chamber 5 is released to an atmospheric pressure. The sample holding member driving unit 44 is configured so as to drive the sample holding member 31 in a predetermined manner. That is, the sample holding system 3 holds the sample S inside the sample chamber 5.

The control system 6 is configured to include a control unit 61, an operation unit 62, and a display unit 63.

The control unit 61 controls an irradiation position and an irradiation range of the ion beam B (refer to FIG. 3) by controlling a position and a direction of the sample holding system 3. The control unit 61 is electrically connected to a discharge power source 81 and an acceleration power source 82 of the power supply system 8 (refer to FIG. 2), and controls a current density of the ion beam B (refer to FIG. 3) by controlling a discharge voltage and an acceleration voltage. The control unit 61 is electrically connected to a roughing vacuum pump and a high vacuum pump of the vacuum evacuation system 7, and controls a degree of vacuum in the sample chamber 5.

The operation unit 62 includes, for example, operation switches such as a start/stop switch and a vacuum/atmospheric pressure switch, a discharge/acceleration voltage variable knob, an argon gas flow rate setting knob, a stage mode setting button, a deposit processing start button, and the like.

The display unit 63 displays a pressure in the sample chamber 5, a discharge current value, an ion beam current value, an argon gas flow rate, an operation mode, a flow rate of an injection gas, an injection frequency of the injection gas, a warning of discharge unstability, a warning of short circuit, and the like. The display unit 63 is configured to include, for example, a light emitting diode, a liquid crystal panel, an organic electroluminescence panel, or the like.

The sample chamber 5 is a space (vacuum chamber) in which the sample S is disposed and airtightness is maintained inside the sample chamber 5, and is a space in which the sample S is milled, that is, the sample S is processed. A shape of the sample chamber 5 is a box shape for a space for forming a vacuum atmosphere, or a shape similar to a box shape. The pressure inside the sample chamber 5 is maintained in an atmospheric pressure, or in a vacuum ($10^{-4}$ Pa to $10^{-3}$ Pa) by the vacuum evacuation system 7. An observation window for observing a state of the processing may be provided.

The vacuum evacuation system 7 is configured to include a roughing pump for evacuating air from the inside of the sample chamber 5 and a high vacuum pump.

The roughing pump is a pump capable of evacuating air to a pressure at which a high vacuum pump can operate. As the roughing pump, for example, a vacuum pump having an exhaust capacity of 135/162 L/min (single phase 100 V at 50/60 Hz) may be used. As the high vacuum pump, for example, a turbo molecular pump may be used.

The power supply system 8 (refer to FIG. 2) is configured to include the discharge power source 81 for generating a voltage to be applied between an anode 11 and a cathode 12, and the acceleration power source 82 for generating a voltage to be applied between a cathode 13 and an acceleration electrode 14. The discharge power source 81 generates an applied voltage of, for example, 0 kV to 1.5 kV. The acceleration power source 82 generates an applied voltage of, for example, 0 kV to 6 kV.

The present embodiment will be described in more detail with reference to the drawings as appropriate.

FIG. 2 is a schematic diagram illustrating configurations of the ion gun 1 and components related to the ion gun 1 in the ion milling apparatus 100 according to the present embodiment.

The ion gun 1 is configured to include the anode 11, a pair of cathodes 12 and 13 disposed with the anode 11 interposed therebetween, the acceleration electrode 14, magnets 15, and a gas inlet 16.

The anode 11 includes a tubular portion and a bottom portion, and is formed in a cylindrical shape extending in an emission direction of the ion beam. The anode 11 is made of, for example, a non-magnetic conductor such as aluminum.

The anode 11 is fitted into the inside of an insulator (not illustrated). An outer circumference surface of the tubular portion is in contact with an inner circumference surface of the insulator, and an inner circumference surface of the tubular portion faces the inside of an ionization chamber 17. The bottom portion is formed on a side opposite to the cathode 12, and an opening 11$h$ (anode hole) is provided in the center portion of the bottom portion. There is no limitation on the shape of the anode 11, and the anode 11 may be formed, for example, in a tubular shape.

Further, the anode 11 is electrically insulated from the cathode 12, the cathode 13, and the magnets 15 by an insulator (not illustrated).

The cathode 13 disposed on the same side as the acceleration electrode 14 is made of, for example, a magnetic conductor such as pure iron. An opening 13$h$ is provided in the center portion of the cathode 13. The opening 13$h$ is formed so as to have a size required for passing the ions and maintaining an appropriate gas partial pressure between a space inside the ionization chamber 17 of the ion gun 1 to which a predetermined gas is supplied from the gas inlet 16 to be described and a space of the sample chamber 5. The cathode 13 disposed on the same side as the acceleration electrode 14 maintains an appropriate gas partial pressure between an atmosphere on the anode 11 side and an atmosphere on the acceleration electrode 14 side, and also functions as an electrode for generating ions.

The cathode 12 disposed on a side opposite to the acceleration electrode 14 with the anode 11 interposed therebetween, is made of, for example, a magnetic conductor such as pure iron. The gas inlet 16 through which a discharge gas G supplied from, for example, a gas cylinder or the like to be described passes, may be provided in the cathode 12. There is no limitation on the shape of the cathode 12, and the cathode 12 may be formed, for example, in a disc shape.

The acceleration electrode 14 is provided on a side opposite to the inside of the ionization chamber 17 with the opening 13$h$ of the cathode 13 interposed therebetween. The acceleration electrode 14 is formed on a side opposite to the cathode 13. The acceleration electrode 14 is made of, for example, a non-magnetic material having conductivity such as stainless steel. An opening 14$h$ (ion beam passing hole) is provided in the center portion of the acceleration electrode 14. The acceleration electrode 14 is maintained at ground potential. In addition, the acceleration electrode 14 may be formed in a tubular shape or in a cylindrical shape.

The magnet 15 is made of a ferromagnetic material with conductivity including a ferromagnetic metal such as a neodymium magnet, and is formed in a cylindrical shape extending in the emission direction of the ion beam. The cathode 12 is attracted to one ends of the magnets 15 by, for example, a magnetic force. The one ends of the magnets 15 are connected to the cathode 12. In addition, the cathode 13 is attracted to the other ends of the magnets 15 by, for example, a magnetic force. The cathode 13 is connected to the other ends of the magnets 15. The cathode 12, the cathode 13, and the magnets 15 are electrically connected to each other, and thus potentials of the cathode 12, the cathode 13, and the magnets 15 are maintained at the same potential.

The ionization chamber 17 is partitioned by the magnets 15, the cathode 12, and the cathode 13, and the opening 13$h$ is also a hole formed on the ionization chamber 17. At this time, the magnets 15 generate a magnetic field inside the ionization chamber 17. In addition, a magnetic path is formed by the cathode 12 and the cathode 13, and thus the magnetic field generated inside the ionization chamber 17 can be strengthened by the cathode 12 and the cathode 13.

Instead of the magnet 15, an electromagnet or the like may be used. In addition, a shape of the magnet 15 is not limited to a cylindrical shape. Thus, the magnet 15 may be formed in a tubular shape.

The insulator (not illustrated) is formed in a cylindrical shape extending in the emission direction of the ion beam. The insulator is disposed inside the magnet 15, and an outer circumference of the insulator is in contact with an inner circumference of the magnet 15. The insulator is formed of, for example, a non-magnetic material with an electrical insulation property such as ceramic.

The Penning-type ion gun used in the present embodiment is a three-electrode type ion gun, and thus energy of ions which hit against the opening 13$h$ (cathode hole) and the opening 14$h$ (ion beam passing hole) can be suppressed. Therefore, the Penning-type ion gun can reduce deformation and contamination of the opening 13$h$ of the cathode 13 and the opening 14$h$ of the acceleration electrode 14, and thus a stable ion current can be obtained.

Although the deformation of the opening 13$h$ of the cathode 13 and the opening 14$h$ of the acceleration electrode 14 can be reduced by the three-electrode type ion gun, expansion of the opening 13$h$ and the opening 14$h$ cannot be avoided as long as ions hit against the openings. The cathode 13 disposed on the same side as the acceleration electrode 14 serves as an orifice for maintaining an appropriate gas partial pressure in the ion gun 1. That is, when the opening 13$h$ is worn and deformed (mainly expanded), an appropriate gas partial pressure cannot be maintained, and as a result, discharge becomes unstable. For this reason, it is preferable to periodically replace the cathode and adjust the gas flow rate at every use.

An electrode member such as the cathode is preferably made of a material having both conductivity and ion resistance. The electrode member such as the cathode is preferably formed of, for example, a hard metal material such as titanium, molybdenum, or tungsten.

The gas inlet 16 is a supply port through which a discharge gas to be ionized in the ion gun 1 is supplied into the ion gun 1. The gas inlet 16 is provided, for example, in the cathode 12 disposed on a side opposite to the acceleration electrode 14. A discharge gas having a low flow rate that does not affect the start of discharge between the electrodes is introduced from the gas inlet 16 into the ionization chamber 17 of the ion gun 1.

The discharge gas introduced into the ion gun 1 (ionization gas) is, for example, a rare gas such as argon, helium, or xenon.

One terminal of the discharge power source 81 is electrically connected to the cathode 12 and the cathode 13. The other terminal of the discharge power source 81 is electrically connected to the anode 11. A discharge voltage is applied between the cathodes 12 and 13 and the anode 11 by the discharge power source 81.

One terminal of the acceleration power source 82 is electrically connected to the cathode 12 and the cathode 13. The other terminal of the acceleration power source 82 is electrically connected to the acceleration electrode 14. An acceleration voltage is applied between the cathodes 12 and 13 and the acceleration electrode 14 by the acceleration power source 82.

FIG. 3 is a schematic diagram illustrating a state where the ion beam B is emitted from the ion gun 1 of the ion milling apparatus 100 according to the present embodiment.

A principle of emission of the ion beam B is explained as follows.

The discharge gas G is introduced into a space surrounded by the anode 11 in the ionization chamber 17 of the ion gun 1 via the gas inlet 16. In the space surrounded by the anode 11 in the ionization chamber 17 of the ion gun 1, a voltage of approximately several kV is applied between the anode 11 and the cathodes 12 and 13 by the discharge power source 81 in a state where an appropriate gas partial pressure is maintained. A positive voltage is applied to the anode 11 with respect to the cathode 12 and the cathode 13. A negative voltage is applied to the cathodes 12 and 13 with respect to the anode 11, and electrons are emitted from front surfaces of the cathodes 12 and 13.

At this time, the magnets 15 are present around the ionization chamber 17, and thus a magnetic field is formed in the ionization chamber 17. In addition, the cathodes 12 and 13 are present on both sides of the anode 11. For this reason, orbits of the emitted electrons are bent by the magnetic field formed in the ionization chamber 17, and thus the emitted electrons rotate. When the electrons rotating in the ionization chamber 17 collide with the introduced discharge gas G, the collided discharge gas G is ionized.

When a negative DC voltage of approximately 0 kV to 6 kV is applied between the cathodes 12 and 13 and the acceleration electrode 14, a part of the plasma-processed (ionized) gas in the ionization chamber 17 passes through the opening 13h provided in the cathode 13, and is drawn out from the ionization chamber 17. The drawn ions are accelerated by the acceleration electrode 14, and are emitted as the ion beam B.

FIG. 4A is a schematic diagram illustrating a state where deposits D are attached to a front surface of the anode 11 of the ion milling apparatus 100 according to the present embodiment. FIG. 4B is a schematic diagram illustrating a state where the anode 11 and the cathode 12 are short-circuited by the deposits D attached to the front surface of the anode 11 of the ion milling apparatus 100 according to the present embodiment.

The DC-discharge-type plasma discharge ion gun also irradiates components of the ion gun such as the acceleration electrode 14, a sample stand, and the like, with an ion beam. Particularly, in the Penning-type ion gun 1, not only the acceleration electrode 14 but also the cathode 13 are irradiated with the ion beam B. For this reason, a phenomenon (redeposition) in which sputtered particles are also discharged from the components of the ion gun 1 and are attached to other components, occurs inside the sample chamber 5 or inside the ion gun 1 (refer to FIG. 4A).

The sputtered particles attached to the anode 11 due to the redeposition are deposited in a layer form with a processing (discharge) time elapse, and are peeled off in a needle shape when a thickness of the layer reaches a certain thickness. The Penning-discharge-type ion gun 1 has a structure in which the anode 11 is interposed between the cathodes 12 and 13, and a voltage is applied between the anode 11 and the cathodes 12 and 13. Since the peeled-off substance De has conductivity, there is a case where the anode 11 and the cathodes 12 and 13 are short-circuited by contacting with the substance De (refer to FIG. 4B). Therefore, in the ion milling apparatus 100, periodical clean and maintenance of the ion gun 1 (anode 11) is necessary.

In an ion milling apparatus in related art, although depending on the material and usage of the cathode, a maintenance cycle of the anode is often approximately 100 hours. Assuming that the ion gun is used twice a day for eight hours each use time, maintenance of the ion gun will be performed every week.

There is a possibility that a short circuit may occur between the electrodes due to the redeposition generated in the ion gun 1, and besides, the conductivity of the electrodes may be decreased in some cases. The deposits D derived from the cathode made of a metal such as titanium or molybdenum are easily oxidized, and as a result, oxidation of the deposits D deposited on the anode 11 causes a decrease in the conductivity of the anode 11. When the conductivity of the anode 11 is decreased, there is a problem that the anode 11 is charged and the discharge becomes unstable.

Therefore, periodic maintenance of the ion gun 1 is preferably performed in order to not only prevent a short circuit between the electrodes but also prevent charging of the anode 11.

FIG. 5A is a schematic diagram illustrating a beam current detection plate 21 provided with a nozzle insertion mechanism according to the present embodiment. FIG. 5B is a schematic diagram illustrating beam current detection by the beam current detection plate 21 provided with the nozzle insertion mechanism according to the present embodiment. FIG. 5C is a schematic diagram illustrating a state where the gas injection nozzle 2 according to the present embodiment is inserted into the ion gun 1.

In the ion milling apparatus 100 according to the present embodiment, the beam current detection plate 21 (shutter) for blocking the ion beam B and measuring a current of the ion beam B is disposed in front of the ion gun 1 so as to be opposed to the opening of the ion gun 1. For example, as illustrated in FIG. 5A, the beam current detection plate 21 according to the present embodiment includes a beam current detection region 22, a beam current blocking region 26, and a gas nozzle port 23 in this order on a surface opposite to the ion gun 1, and includes a nozzle insertion port 25 and a nozzle fixing jig 24 on a surface on the sample S side (opposite side).

For example, as illustrated in FIGS. 5B and 5C, the beam current detection plate 21 has a structure in which the gas nozzle port 23 and the nozzle insertion port 25 communicate with each other, and in which the gas injection nozzle 2 can pass through the inside of the beam current detection plate 21. A path from the nozzle insertion port 25 to the gas nozzle port 23 has a circular shape section, and is disposed in an arc shape in a section when viewed toward the opening of the ion gun 1. Thus, blockage due to distortion or the like of the gas injection nozzle 2 can be prevented.

The gas injection nozzle 2 may be connected to an injection gas supply mechanism that is configured to include a gas supply valve which can adjust an injection pressure, an injection amount, an injection time, and the like of the injection gas, and a gas holder which temporarily stores the injection gas (not illustrated). The injection gas is supplied to the injection gas supply mechanism from a gas supply source such as a gas cylinder.

For example, as illustrated in FIG. 5C, the gas injection nozzle 2 is inserted and fixed into the nozzle fixing jig 24 on a back surface of the beam current detection plate 21, and is inserted into the nozzle insertion port 25 from the back surface. The inserted gas injection nozzle 2 is supported by the path from the nozzle insertion port 25 to the gas nozzle port 23. In addition, the gas injection nozzle 2 is supported by the gas nozzle port 23, and protrudes from the gas nozzle port 23 (refer to FIG. 5C).

In the present embodiment, preferably, the gas injection nozzle 2 is made of a material which can be deformed by an external stress and has appropriate elasticity such that the gas injection nozzle 2 can be inserted from the nozzle insertion port 25 to the gas nozzle port 23. In addition, the gas injection nozzle 2 may be made of a material which is not easily deformed by a weight of the gas injection nozzle or injection of the injection gas. Examples of the material of the gas injection nozzle 2 include, for example, a polyethylene-based resin, a polypropylene-based resin, a fluorine-based resin, and the like.

A shape of a gas injection port at the tip of the gas injection nozzle 2 may be any shape. By the shape of the gas injection port at the tip of the gas injection nozzle 2 to, for example, an ellipse, the deposits D with a wide range can be processed at once. By forming the gas injection port in a shape of, for example, a circle with a small diameter, the pressure of the injection gas is increased, and thus the deposits D can be reliably processed.

An outer diameter of the gas injection nozzle 2 may be appropriately set to an outer diameter such that the gas injection nozzle 2 can be inserted into the inside of the ion gun 1 via the opening of the ion gun 1. An inner diameter of the gas injection nozzle 2 may be appropriately set to an inner diameter such that the injection gas can be injected into the opening of the ion gun 1 and the inside of the ion gun 1. A length of the gas injection nozzle 2 may be appropriately set to a length such that the gas injection nozzle 2 can be inserted into the inside of the ion gun 1 via the opening of the ion gun 1.

The beam current detection plate 21 includes, for example, a support portion with a thread portion on an upper portion thereof, and is configured so as to move on at least one axis in a vertical direction (vertically move) by rotation of a gear which forms a pair so as to engage with the threaded portion (not illustrated).

The gas injection nozzle 2 includes, for example, a threaded portion, and is configured to move (vertically move) on at least one axis in a vertical direction by rotation of a gear which forms a pair so as to engage with the threaded portion. The threaded portion may be configured, for example, by inserting a cylindrical separate member with a threaded portion on an outer circumference thereof (gear) into the gas injection nozzle 2.

The beam current detection plate 21 and the gas injection nozzle 2 may be configured to be driven by one gear by making the gear for driving the beam current detection plate 21 and the gear for driving the gas injection nozzle 2 identical.

Even when there is only one gear to be driven, by changing the number of threads of the beam current detection plate 21 with respect to the number of threads of the gear and the number of threads of the gas injection nozzle 2 with respect to the number of threads of the gear (by changing a gear ratio), a movement amount of the beam current detection plate 21 and a movement amount of the gas injection nozzle 2 can be changed. In other words, by setting the number of threads of the beam current detection plate 21 to a number larger than the number of threads of the gas injection nozzle 2, it is possible to make the movement amount of the gas injection nozzle 2 greater than the movement amount of the beam current detection plate in rotation of one gear.

Accordingly, the gas injection nozzle 2 protrudes or retracts from the gas nozzle port 23. At a position for processing of the deposits (FIG. 5C), the gas injection nozzle 2 may be configured so as to be inserted into the inside of the ion gun 1 from the opening of the ion gun 1.

As the injection gas which is injected for processing (removing or moving) of the deposits D, preferably, a gas is used, the gas being unlikely to affect emission or processing of the ion beam B even in a case where the injection gas remains inside the sample chamber 5 or the ion gun 1. More preferably, the injection gas is a gas of the same type as that of the discharge gas G in the ion gun 1.

Next, the sample holding system 3 of the ion milling apparatus 100 according to the present embodiment will be described.

The sample holding member installation portion 41 according to the present embodiment is configured to include, for example, an X-direction movement stage, a Y-direction movement stage, and a Z-direction movement stage.

In addition, the sample holding member installation portion 41 according to the present embodiment may be a stage which can perform a well-known five-axis control including three-dimensional movement in the XYZ direction, rotation around an axis perpendicular to the XY plane, and tilt.

The sample holding system 3 according to the present embodiment may include a sample rotation stage that rotates the provided sample holding member 31, an angle adjustment mechanism that can arbitrarily adjust a tilt angle of the rotation central axis of the sample rotation stage with respect to the center line of the ion beam B, and a sample position adjustment mechanism that can eccentrically adjust a position relationship between the rotation axis of the sample rotation stage and the center line of the ion beam B. The sample rotation stage includes, for example, a gear mechanism, and is driven by the sample holding member driving unit 44. Thus, the provided sample holding member 31 rotates.

The control system 6 according to the present embodiment will be described in detail.

As described above, the control system 6 is configured to include the control unit 61, the operation unit 62, and the display unit 63. The control unit 61 is configured to include an arithmetic processing unit, a storage unit, an input unit, and an output unit.

The arithmetic processing unit is configured to include a central processing unit (CPU). The arithmetic processing unit reads a program stored in the storage unit, and performs computation required for controlling the ion milling apparatus 100. The arithmetic processing unit is connected to the input unit, the output unit, and the like, receives various information signals, and transmits the computation result as a signal required for controlling the ion milling apparatus 100.

The storage unit is configured to include a storage medium such as a read only memory (ROM) and a random access memory (RAM). In the storage unit, an automation program for an ion milling operation, an automation program for processing of the deposits (short circuit solution, discharge stabilization, and the like), a control program of the ion gun 1, a control program of the vacuum evacuation system 7, a control program of the power supply system 8, and the like are stored. In addition, various state data when the apparatus performs processing, such as the applied voltage between the anode and the cathode, the applied voltage between the cathode and the acceleration electrode, and the beam current value, may be stored. A processing condition of ion milling that is set by a user, a processing condition of ion milling which is performed before, and the like may be stored.

The arithmetic processing unit and the storage unit of the control unit 61 may be configured as a microcomputer having the functions (hereinafter, referred to as a micom as appropriate). In addition, the arithmetic processing unit and the storage unit of the control unit 61 may be configured as a personal computer capable of realizing the functions.

The input unit is configured to include measurement detection means such as a sensor that measures a current flowing through the cathode, a sensor that measures the applied voltage between the anode and the cathode and the applied voltage between the cathode and the acceleration electrode, and a sensor that measures a current value of the beam current. The input unit may include receiving means for receiving an operation instruction of the operation unit 62.

The output unit is configured to include means for generating a sound for notifying processing end, a warning sound for notifying abnormality when performing automatic control, a computation result of the arithmetic processing unit, and display data for notifying a control mode of the automatic control.

Next, an operation method of the ion milling apparatus 100 according to the present embodiment will be described.

In the operation unit 62 (operation panel), for example, for a setting in which input of a numerical value is required, an input window can be selected by a select key (Select) and a numerical value can be selected by "Up" and "Down" buttons. Further, registration of the selected numerical value is performed by an enter key (Enter).

A gas injection condition setting unit (not illustrated) for setting a condition for maintenance of the ion gun 1 by gas injection of the injection gas from the gas injection nozzle 2 is provided on the operation unit 62 (operation panel).

The ion milling (processing) method of the sample S by the ion beam according to the present embodiment will be described.

In the ion milling method according to the present embodiment, by inserting the gas injection nozzle 2 for injecting the injection gas into the inside of the ion gun 1 and injecting the injection gas between the anode 11 and the cathode 12, the deposits D that cause a short circuit or discharge unstability can be processed (blow off).

An operation signal (selection information) of the operation unit 62 is transmitted to the arithmetic processing unit via the input unit of the control system 6. The arithmetic processing unit performs computation on the transmitted input signal based on the program which is read, and transmits the computation result to the sample holding member driving unit 44 and the output unit. The sample holding member driving unit 44 performs driving of the sample holding member under a condition selected by the operation unit 62 based on the received control signal.

FIG. 6 is a flowchart illustrating an operation procedure before the start of the processing according to the present embodiment.

First, the sample S to be processed is disposed in the sample chamber 5 by a user who uses the ion milling method. After the disposition of the sample S is completed, the user presses a vacuum evacuation start button disposed on the operation unit 62 (evacuation start).

A signal according to pressing of the vacuum evacuation start button is transmitted to the arithmetic processing unit via the input unit of the control unit 61. When receiving the signal according to pressing of the vacuum evacuation start button, the arithmetic processing unit reads, from the storage unit, a maintenance program of the ion gun 1 before processing that is performed by injection of the injection gas, or performs maintenance of the ion gun 1 based on a maintenance program which is read in advance. Specifically, the procedure is as follows.

The control unit 61 confirms that all the vacuum pumps of the vacuum evacuation system. 7 (refer to FIG. 1) are stopped (S1). In a case where all the vacuum pumps are not stopped, the control unit 61 stops all the vacuum pumps. By this operation, it is possible to prevent breakage of the vacuum evacuation system 7 due to opening of the sample chamber 5 to the atmosphere in a state where the vacuum evacuation system (refer to FIG. 1) operates.

The control unit 61 may transmit a signal indicating that the ion gun 1 is under maintenance to the output unit so as to notify the fact to the user by using display or the like of the output unit.

Next, the control unit 61 confirms that the inside of the sample chamber 5 is opened to the atmosphere, by using the pressure sensor of the input unit (S2). In a case where the inside of the sample chamber 5 is not opened to the atmosphere, for example, the control unit 61 transmits a signal to the vacuum evacuation system 7 such that the inside of the sample chamber 5 is opened to the atmosphere by stopping the pumps.

The control unit 61 moves the beam current detection plate 21 including the gas injection nozzle 2 via the output unit such that the gas injection nozzle 2 (opening of the gas injection nozzle 2) is opposed to the opening (emission opening) of the ion gun 1 (S3).

The control unit 61 may extend the gas injection nozzle 2 in accordance with the movement of the beam current detection plate 21 such that the gas injection nozzle 2 is brought close to the opening of the ion gun 1.

In a state where the gas injection nozzle 2 is opposed to the opening of the ion gun 1, the control unit 61 injects the injection gas from the gas injection nozzle 2 toward the inside (opening) of the ion gun 1 (S4).

Here, the injection pressure of the injection gas is preferably 0.01 MPa or more. The injection time of the injection gas is preferably one second or more in total. When injecting the injection gas, the injection range of the injection gas may be expanded by moving the beam current detection plate 21 including the gas injection nozzle 2 while maintaining the state where the gas injection nozzle 2 is opposed to the opening of the ion gun 1. The injection pressure of the injection gas may be changed during the injection of the injection gas. The injection of the injection gas may be intermittently performed. Since the inside of the sample chamber 5 and the inside of the ion gun 1 are opened to the atmosphere, when deceleration of the injection gas is considered, preferably, the injection pressure of the injection gas is set to be high.

The injected injection gas blows off attachments such as the deposits D attached to the acceleration electrode 14 disposed around the opening of the ion gun 1, dust, and the like. By this operation, it is possible to prevent or suppress occurrence of sample processing interruption reasons such as a short circuit between the acceleration electrode 14 and the cathode 13, and a short circuit between the anode 11 and the cathodes 12 and 13 that are caused by the deposits D during the sample processing.

In addition, there is no need to completely blow off the deposits D, and a contact (a short circuit) between the anode 11 and the cathodes 12 and 13, a contact (a short circuit) between the acceleration electrode 14 and the cathode 13, and the like may be solved by slightly moving the deposits D.

Subsequently, the control unit 61 inserts the gas injection nozzle 2 into the opening (emission opening) of the ion gun 1 by feeding the gas injection nozzle 2 (refer to FIG. 5C) (S5).

In a state where the gas injection nozzle 2 is inserted into the opening of the ion gun 1, the control unit 61 injects the injection gas from the gas injection nozzle 2 toward the inside of the ion gun 1 (S6). The injection pressure of the injection gas is preferably 0.01 MPa or more. The injection time of the injection gas is preferably one second or more in total. When injecting the injection gas, the injection range of the injection gas may be expanded by moving the gas injection nozzle 2. The injection pressure of the injection gas may be changed during the injection of the injection gas. The injection of the injection gas may be intermittently performed.

The injected injection gas blows off attachments such as the deposits D attached to the acceleration electrode 14 disposed around the emission opening of the ion gun 1, dust, and the like. In addition, the injected injection gas blows off attachments such as the deposits D attached to the anode 11, the cathodes 12 and 13, or the like disposed inside the ion gun 1, dust, and the like. By this operation, it is possible to prevent or suppress occurrence of sample processing interruption reasons such as a short circuit between the anode 11 and the cathodes 12 and 13, and a short circuit between the acceleration electrode 14 and the cathode 13 that are caused by the deposits D during the sample processing. Further, it is possible to reduce the number of maintenance involving disassembly of the ion gun 1.

In addition, there is no need to completely blow off the deposits D, and a contact (a short circuit) between the anode 11 and the cathodes 12 and 13, a contact (a short circuit) between the acceleration electrode 14 and the cathode 13, and the like may be solved by slightly moving the deposits D.

The discharge of the deposits D from the ion gun 1 will be described later in a fourth embodiment to be described.

The maintenance of the ion gun 1 before processing (S3 to S6) that is performed by injection of the injection gas J is performed for a purpose of preventing occurrence of sample processing interruption reasons. Thus, preferably, the maintenance of the ion gun 1 before processing is performed for the same portion for a total of 15 seconds or less. Therefore, it is possible to prevent the injection gas from being injected more than necessary, thereby improving processing efficiency and saving the injection gas.

When the maintenance of the ion gun 1 before processing that is performed by injection of the injection gas is completed, the control unit 61 moves the gas injection nozzle 2 (ion current detection plate 21) to a position that does not hinder irradiation of the ion beam B (S7). At the same time, the control unit 61 moves a shutter position of the ion current detection plate 21 to a position opposite to the ion gun 1.

For example, the controller 61 transmits a signal to the vacuum evacuation system 7 so as to close an atmosphere opening valve, and thus preparation for vacuum evacuation is performed by the vacuum evacuation system 7.

The control unit 61 transmits a signal to the vacuum evacuation system 7 such that the pump of the vacuum evacuation system 7 performs vacuum evacuation of the inside of the sample chamber 5 and the inside of the ion gun 1 to obtain a pressure at which the ion beam B can be emitted (S8). The operation of the high vacuum evacuation pump may be performed after a state in the sample chamber 5 is stabilized.

The control unit 61 confirms that the inside of the sample chamber 5 is evacuated, by using the pressure sensor of the input unit.

The control unit 61 may transmit a signal for generating a display or a sound notifying that the vacuum evacuation in the sample chamber 5 is completed to the output unit so as to notify the fact to the user by using display or the like of the output unit. At the same time, the control unit 61 may notify the user of that an operation such as input of the processing condition is possible so as to prompt the operation.

By the processes, the maintenance of the ion gun 1 before processing that is performed by injection of the injection gas is completed.

The control unit 61 waits for an operation by the user such as input of the processing condition, pressing of a processing start button, or the like (standby).

In a case of controlling, based on the control program, processes during a period for which the sample is disposed in the sample chamber and the sample chamber is opened to the atmosphere after completion of the processing, the control unit 61 may successively start processing of the sample S without notifying that the vacuum evacuation in the sample chamber 5 is completed or that input of the processing condition is possible.

As the ion gun 1 is energized and discharging is performed, the deposits D are deposited inside the ion gun 1 due to the redeposition, and as a result, the deposits D are also attached to the acceleration electrode 14 and the cathode 13 around the opening for the ion beam B.

Here, detection of the deposits D and processing of the deposits D during the sample processing will be described.

In the ion milling method according to the present embodiment, the control unit 61 constantly checks a state of the ion gun 1 during discharge and a state of the ion gun 1 during the sample processing. In a case where a short circuit between the electrodes or discharge unstability of the ion gun 1 is detected, the control unit 61 temporarily stops the processing of the sample S, and injects the injection gas toward the ion gun 1.

A short circuit between the electrodes or discharge unstability of the ion gun 1 is detected, for example, in the following manner (criteria for determination of a short circuit between the electrodes and discharge unstability).

The control unit 61 monitors a current of the beam B on the beam current detection region 22 of the beam current detection plate 21 connected to the input unit. When the current flowing through a detector as the beam current detection region 22 is equal to or lower than a detection limit of the beam B even though the discharge voltage is applied to the ion gun 1, the control unit 61 determines that the discharge of the ion gun 1 is stopped, and determines that a short circuit between the electrodes occurs.

In a case where a current flowing through the cathode 12 and the discharge power source 81 is detected by the sensor of the input unit, and where the current value is greater than a predetermined current value, the control unit 61 may determine that a short circuit occurs between the anode 11 and the cathode 12. In a case where a current flowing through a point between the anode 11 and the discharge power source 81 is measured, and where the current is greater than a predetermined value, the control unit 61 may determine that a short circuit occurs between the anode 11 and the cathode 12.

Similarly, the control unit 61 monitors a current of the beam B on the beam current detection region 22 of the beam current detection plate 21 connected to the input unit. In a case where a variation in the current flowing through the detector as the beam current detection region 22 for a predetermined time (for example, five minutes) is greater than a predetermined value (for example, 5% or more), the control unit 61 determines that the discharge of the ion gun 1 is unstable.

In a case where the current flowing through a point between the cathode 12 and the discharge power source 81 is measured, and where a variation in the current for a predetermined time (for example, five minutes) is greater than a predetermined value (for example, 5% or more), the control unit 61 may determine that the discharge of the ion gun 1 is unstable. In a case where the current flowing through a point between the anode 11 and the discharge power source 81 is measured, and where a variation in the current for a predetermined time (for example, five minutes) is greater than a predetermined value (for example, 5% or more), the control unit 61 may determine that the discharge of the ion gun 1 is unstable.

In a case where the current flowing through the acceleration electrode 14 and the acceleration power source 82 is measured, and where the current is greater than a predetermined value, the control unit 61 may determine that a short circuit occurs between the cathode 13 and the acceleration electrode 14.

In a case where the current flowing through the acceleration electrode 14 and the acceleration power source 82 is measured, and where a variation in the current for a predetermined time (for example, five minutes) is greater than a predetermined value (for example, 5% or more), the control unit 61 may determine that the discharge of the ion gun 1 is unstable.

The state of the ion gun 1 may be confirmed at appropriate time intervals such as every one minute or every three minutes, in parallel with the processing of the sample S.

In a case where a short circuit between the electrodes or discharge unstability of the ion gun 1 is detected by the control unit 61, the control unit 61 proceeds to injection of the injection gas.

FIG. 7 is a flowchart illustrating an operation procedure for processing (removing) the deposits D of the ion milling apparatus 100 during the sample processing according to the present embodiment.

In the case of injecting the injection gas for a purpose of processing (removing) the deposits D, the control unit 61 stops the high vacuum evacuation pump such as a turbo molecular pump that is included in the vacuum evacuation system 7 (S11), and confirms the stop of the high vacuum evacuation pump. By this operation, it is possible to avoid a failure of the high vacuum evacuation pump of the vacuum evacuation system 7 due to a sudden change in the degree of vacuum in the sample chamber 5 according to the injection of the injection gas.

In addition, preferably, the vacuum evacuation of the sample chamber 5 is continued by the roughing vacuum pump such as a rotary pump that is included in the vacuum evacuation system 7. Therefore, the inside of the sample chamber 5 and the inside of the ion gun 1 can be maintained in a vacuum state or in a depressurization state with a pressure lower than the atmospheric pressure.

Since an amount of the discharge gas supplied from a gas supply port of the ion gun 1 is extremely small, the amount of the discharge gas does not affect the injection of the injection gas from the gas injection nozzle 2. Thus, the supply of the discharge gas may be continued or stopped before the injection of the injection gas.

Next, the control unit 61 makes the opening (emission opening) of the ion gun 1 and the gas nozzle port 23 face each other (S12) by moving the beam current detection plate 21 downward, while maintaining the inside of the sample chamber 5 and the inside of the ion gun 1 in a vacuum state or in a depressurization state with a pressure lower than the atmospheric pressure.

In a case where the deposits Dare attached to the opening of the ion gun 1 such as the acceleration electrode 14 and the cathode 13, the control unit 61 transfers the gas injection nozzle 2 toward the opening of the ion gun 1 (S13).

The movement of the beam current detection plate 21 (S12) and the extension of the gas injection nozzle 2 (S13) may be performed at the same time.

In this state, the control unit 61 injects the injection gas from the gas injection nozzle 2 toward the acceleration electrode 14 and the cathode 13 by supplying the injection gas from the injection gas supply mechanism to the gas injection nozzle 2 (S14). By this operation, the deposits D (attachments), which are attached to the opening of the acceleration electrode 14 and the opening of the ion gun 1 (cathode 13) and cause the discharge unstability, are blown off and processed (removed). There is no limitation on the number of injections of the injection gas. The injection of the injection gas may be performed not only once but also plural times.

In addition, there is no need to completely blow off the deposits D, and the discharge unstability may be solved by slightly moving the deposits D. That is, a contact (a short circuit) between the anode 11 and the cathode 12, a contact (a short circuit) between the acceleration electrode 14 and the cathode 13, and the like due to the deposits D, may be solved.

The discharge of the deposits D from the ion gun 1 will be described later in a fourth embodiment to be described.

Since the inside of the sample chamber 5 and the inside of the ion gun 1 are in a vacuum state or in a depressurization state with a pressure lower than the atmospheric pressure, the injection gas which is injected is unlikely to decelerate. Therefore, even when the injection pressure of the injection gas is lower than the injection pressure of the injection gas before the sample processing (the injection pressure in S4), the same effect as before the sample processing can be obtained. Thus, it is possible to save the injection gas by decreasing the injection pressure of the injection gas.

In a case where the deposits D are attached between the anode 11 and the cathode 12, the control unit 61 further expands the gas injection nozzle 2 and inserts the gas injection nozzle 2 into the inside of the ion gun 1 from the openings (opening 14h and opening 13h) of the ion gun 1 (refer to FIG. 5B) (S15).

The movement of the beam current detection plate 21 and the extension of the gas injection nozzle 2 may be performed at the same time.

In this state, the control unit 61 injects the injection gas from the gas injection nozzle 2 toward the anode 11 and the cathodes 12 and 13 by supplying the injection gas from the injection gas supply mechanism to the gas injection nozzle 2 (S16). By this operation, the deposits D (attachments), which are deposited (attached) to the anode 11 and the cathodes 12 and 13 and cause a short circuit, are blown off and processed (removed). There is no limitation on the number of injections of the injection gas. The injection of the injection gas may be performed not only once but also plural times.

After the deposits D are processed (removed) by the injection of the injection gas, the control unit 61 moves the gas injection nozzle 2 to a position that does not hinder irradiation of the ion beam B (S17). The control unit 61 moves the gas injection nozzle 2 such that the ion gun 1 faces the beam current detection region 22.

The control unit 61 operates the high vacuum evacuation pump again (S18). Accordingly, the control unit 61 depressurizes the inside of the sample chamber 5 and the inside of the ion gun 1 to a pressure at which the ion beam B can be emitted. The operation of the high vacuum evacuation pump may be performed again after the gas state in the sample chamber 5 is stabilized.

After the inside of the sample chamber 5 and the inside of the ion gun 1 reach a vacuum state at which the ion beam B can be emitted, the control unit 61 restarts the temporarily-stopped processing of the sample S.

Alternatively, after confirming that there is no short circuit between the electrodes or discharge unstability of the ion gun 1 by applying the discharge voltage to the ion gun 1 (after confirming that the inside of the sample chamber 5 and the inside of the ion gun 1 do not correspond to the criteria for determining the short circuit between the electrodes and the discharge unstability), the control unit 61 may restart the temporarily-stopped processing of the sample S.

In a case where the processing (removal) of the deposits D by the injection of the injection gas is insufficient, during a period for which the discharge voltage is applied again to the ion gun 1 or after the sample processing is restarted, the control unit 61 detects again a short circuit between the electrodes or discharge unstability of the ion gun 1. Therefore, in a case where a short circuit between the electrodes or discharge unstability of the ion gun 1 is detected again, the control unit 61 may try to perform the processing (removal) of the deposits D by injecting the injection gas again.

In addition, in a case where the number of times the processing (removal) of the deposits D is performed (tried) in a predetermined time (for example, 15 minutes) exceeds a predetermined number of times (for example, five times), the control unit 61 (arithmetic processing unit) may display a message indicating that maintenance of the ion gun 1 is recommended since a short circuit between the anode 11 and the cathodes 12 and 13 or discharge unstability due to the deposits D remarkably occurs, on the display unit 63.

Further, in order to prevent a failure in the processing of the sample S, the control unit 61 may stop the processing of the sample S and display the message on the display unit 63.

The ion milling apparatus 100 according to the present embodiment is configured such that the gas injection nozzle 2 is disposed in the sample chamber 5. Thus, the ion milling apparatus 100 can process (remove) the deposits D by injecting the injection gas while maintaining the inside of the sample chamber 5 in a vacuum state.

Even in a case where a short circuit occurs during the sample processing, according to the ion milling method of the present embodiment, return from a short-circuit state can be made without opening the sample chamber 5 to the atmosphere. Even in a case where discharge unstability occurs during the sample processing, discharge stabilization can be made without opening the sample chamber 5 to the atmosphere.

Even in a case where a short circuit or the like occurs during the processing of the sample S in an environment in which water and oxygen are blocked and which is typified by an alkali metal, an alkaline earth metal (metal Li or the like), or the like, by using a so-called inert gas (argon or the like) as the injection gas, return from a short-circuit state or the like can be made without causing a deterioration of the sample (exposure to the atmosphere). Even in a case where a short circuit or the like occurs during the sample processing in which atmosphere shielding is required, by using a so-called inert gas (argon or the like) as the injection gas, return from a short-circuit state can be made without causing a deterioration of the sample (exposure to the atmosphere). In addition, discharge stabilization can be made without causing a deterioration of the sample (exposure to the atmosphere).

In the related art, in a case where a short circuit between the electrodes of the ion gun occurs during the ion milling processing, in order to process (remove) the deposits on the front surface of the anode and the deposits which cause a short circuit between the anode and the cathode, it is necessary to maintain the ion gun by disassembling the ion gun. In addition, it is necessary to stop the ion milling processing and wait until a temperature of the electrode components of the ion gun, which has a high temperature according to application of a high voltage, is decreased to such a degree that the user can touch the electrode components with a hand. Further, in order to disassemble the ion gun, it is necessary to open the sample chamber to the atmosphere.

In cross-section ion milling processing, the processing of the sample may be performed while indirectly cooling the sample using liquid nitrogen or the like. When the sample chamber is opened to the atmosphere while the ion milling apparatus is in a cooled state, frost is attached to the apparatus. Due to the frost attachment, performance of the apparatus deteriorates. For this reason, in a case where a short circuit occurs during the cooling processing, in addition to an operation during non-cooling of the sample, in order to avoid the frost attachment to the sample when opening the sample chamber to the atmosphere, the apparatus stops the cooling and waits for a long time until the temperature of the sample increases to a room temperature while maintaining the vacuum state. Thus, the temperature of the apparatus is returned to the room temperature. Thereafter, the problem such as a short circuit is solved by opening the apparatus to the atmosphere and performing the processing (removal) of the deposits D or the like.

In the present embodiment, the gas injection nozzle 2 supported by the beam current detection plate 21 is provided in the sample chamber 5. Therefore, it is possible to inject the injection gas while maintaining the inside of the sample chamber 5 to the degree of vacuum at which the frost attachment can be prevented without opening the sample chamber 5 to the atmosphere. It is possible to process (remove) the deposits D while preventing the frost attachment without opening the sample chamber 5 to the atmosphere. Thus, the short circuit can be solved and discharge can be stabilized.

That is, it is possible to solve the short circuit and stabilize the discharge without a waiting time for which the apparatus returns to the room temperature state from the cooled state, and it is possible to restart stable processing without a waiting time for which the apparatus enters into the cooled state from the room temperature state.

The deposits D are processed (removed) by injecting the injection gas from the gas injection nozzle 2, and thus return from the short-circuit state or the like can be made without disassembling the ion gun 1. In addition, the deposits D are processed (removed) by injecting the injection gas, and thus return from the short-circuit state or the like can be made without a waiting time for which the temperature of the components of the ion gun 1 that is increased according to the processing is decreased.

In addition, it is possible to inject the injection gas while maintaining the position of the sample stand 32. Thus, even when the processing is continued after the short-circuit state or the like is solved, reproducibility of the irradiation position (processing position) of the ion beam B is high, and inconvenience hardly occurs.

In the processing of the deposits D or the processing of the sample, by using a so-called inert gas (argon or the like), the sample S to be processed does not react with the injection gas used for the processing of the deposits D or the like.

Hereinafter, embodiments and modification examples which are different from the first embodiment will be described. The same components as those in the first embodiment are denoted by the same reference numerals, and repeated explanations will be omitted. In addition, repeated explanations for the same effect as in the first embodiment will be omitted.

Second Embodiment

In the present embodiment, the insertion position of the gas injection nozzle is changed from that in the first embodiment, and the gas injection nozzle 2a is inserted into the inside of the ion gun 1a by providing the gas injection nozzle insertion port 18a in the cathode 12a which is positioned on a side opposite to the opening of the ion gun.

FIG. 8A is a schematic diagram illustrating the cathode 12a of the ion gun 1a in which the gas injection nozzle insertion port 18a according to the present embodiment is provided in the cathode 12a. FIG. 8B is a schematic sectional diagram illustrating the ion gun 1a in which the gas injection nozzle insertion port 18a according to the present embodiment is provided in the cathode 12a.

The position at which the insertion port 18a of the gas injection nozzle 2a is provided is preferably a position that does not affect ionization of the gas (plasma generation), and is preferably in a region other than the discharge region 20 (refer to FIG. 8A). At least one insertion port 17 may be provided.

Since the insertion port 18a of the gas injection nozzle 2 is provided in the cathode 12a positioned on the side opposite to the opening of the ion gun 1, it becomes easy to inject the injection gas J in the vicinity of the anode 11 and the cathode 12a, and thus it is possible to lower the injection pressure of the injection gas J (refer to FIG. 8B). The injection pressure of the injection gas J is lowered, and thus a used amount of injection gas J such as argon can be reduced. The deposits (not illustrated) which cause a short circuit between the anode 11 and the cathode 12a are likely to be processed (removed) by the gas injection of the gas injection nozzle 2a.

In addition, by providing the gas injection port of the gas injection nozzle 2a at a position parallel to the front surface of the anode 11, the deposits (not illustrated) deposited on the front surface of the anode 11 can be processed (removed) so as to be separated from the front surface of the anode 11.

It is possible to inject the injection gas J while maintaining the position of the sample holding system 3, and thus it is possible to maintain processing accuracy of the sample S.

Even in the present embodiment, there is no limitation on the material for forming the gas injection nozzle 2a. Here, preferably, the gas injection nozzle 2a is made of a material that has appropriate elasticity by which the nozzle can be inserted from the insertion port 18a into the inside of the ion gun 1a and that is unlikely to be deformed due to external stress, a weight of the nozzle, the injection of the injection gas J, or the like. Examples of the material of the gas injection nozzle 2a include, for example, a polyethylene-based resin, a polypropylene-based resin, a fluorine-based resin, and the like.

A shape of the gas injection nozzle 2a may be any shape. By closing the tip of the gas injection nozzle 2a and providing the gas injection port of the gas injection nozzle 2a, for example, on a side surface of the tip portion of the nozzle, it is also possible to directly inject the gas to the deposits that cause a short circuit between the anode 11 and the cathodes 12 and 13. In addition, the deposits (not illustrated) deposited on the front surface of the anode 11 can be processed (removed) by the tip of the nozzle so as to be separated from the front surface of the anode 11.

In the present embodiment, preferably, an airtight seal is provided in the insertion port 18a. Accordingly, it is possible to process (remove) the deposits (not illustrated) by inserting the gas injection nozzle 2a while maintaining the inside of the ion gun 1a and the inside of the sample chamber 5 in a vacuum state.

An insertion mechanism (not illustrated) of the gas injection nozzle may have an arbitrary structure. For example, as in the first embodiment, a mechanism using a gear may be used.

Third Embodiment

In the present embodiment, the insertion position of the gas injection nozzle is changed from that in the first embodiment, and the gas injection nozzle 2b is inserted into the inside of the ion gun 1b by providing the insertion port 18b of the gas injection nozzle 2b in the magnet 15b of the ion gun 1b.

FIG. 9 is a schematic diagram illustrating a section of the ion gun 1b in which the gas injection nozzle insertion port 18b according to the present embodiment is provided in the magnet 15b.

The position at which the insertion port 18b of the gas injection nozzle 2b is provided is preferably a position that does not affect the magnetic field formed by the magnet 15b. At least one insertion port 18b may be provided, and a plurality of insertion ports 18b may be provided so as to suppress an influence on the magnetic field. In the case of providing the plurality of insertion ports, in order to suppress an influence on the magnetic field, preferably, the insertion ports 18b are provided symmetrically with respect to the central axis (ion beam axis) of the magnet 15b.

By providing the insertion port 18b between the anode 11 and the cathode 12, the injection gas can be easily injected in the vicinity of the anode 11 and the cathode 12, and thus the injection pressure of the injection gas can be lowered. The injection pressure of the injection gas is lowered, and thus a used amount of injection gas such as argon can be reduced. The deposits (not illustrated) which cause a short circuit between the anode 11 and the cathode 12 are likely to be processed (removed) by the gas injection of the gas injection nozzle 2b.

It is possible to inject the injection gas while maintaining the position of the sample holding system. 3 (refer to FIG. 1), and thus it is possible to maintain processing accuracy of the sample S.

Even in the present embodiment, there is no limitation on the material for forming the gas injection nozzle 2b. Here, preferably, the gas injection nozzle 2b is made of a material that has appropriate elasticity by which the nozzle can be inserted from the insertion port 18b into the inside of the ion gun 1b and that is unlikely to be deformed due to external stress, a weight of the nozzle, the injection of the injection gas, or the like. Examples of the material of the gas injection nozzle 2b include, for example, a polyethylene-based resin, a polypropylene-based resin, a fluorine-based resin, and the like.

A shape of the gas injection nozzle 2b may be any shape. By closing the tip of the gas injection nozzle 2b and providing the gas injection port of the gas injection nozzle 2b, for example, on a side surface of the tip portion of the nozzle, the deposits (not illustrated) deposited on the front surface of the anode 11 can be processed (removed) so as to be separated from the front surface of the anode 12. In addition, by closing the tip of the nozzle, it is possible to directly move the deposits (not illustrated) by the tip of the nozzle, the deposits causing a short circuit between the anode and the cathode.

In the present embodiment, preferably, an airtight seal is provided in the insertion port 18b. Accordingly, it is possible to process (remove) the deposits by inserting the gas injection nozzle 2b while maintaining the inside of the ion gun 1b and the inside of the sample chamber in a vacuum state.

An insertion mechanism (not illustrated) of the gas injection nozzle 2b may have an arbitrary structure. For example, as in the first embodiment, a mechanism using a gear may be used.

Fourth Embodiment

In the present embodiment, discharge ports for the deposits are provided in the ion gun, and the discharge ports (exhaust ports) are provided in the magnet of the ion gun.

FIG. 10A is a schematic diagram illustrating the ion gun 1c in which the discharge ports are provided in the magnets 15c according to the present embodiment. FIG. 10B is a schematic diagram illustrating the magnet 15c of the ion gun 1c according to the present embodiment.

By providing the discharge ports 19 for the deposits (not illustrated) in the magnets 15c of the ion gun 1c, it is possible to discharge the deposits D removed from the front surface of the anode 11, from the ion gun 1c, for example, by the injection gas J. Therefore, it is possible to use the ion milling apparatus for a long time without disassembling the ion gun 1c.

The position at which the discharge port 19 is provided is preferably a position that does not affect ionization of the gas (plasma generation). A plurality of discharge ports 19 may be provided so as to suppress an influence on the magnetic field. In the case of providing the plurality of discharge ports, in order to suppress an influence on the magnetic field, preferably, the discharge ports 19 are provided symmetrically with respect to the central axis (ion beam axis) of the magnet 15c (refer to FIG. 10B).

When the discharge port 19 is provided at a position between the cathode 12 and the anode 11 that is positioned on a side opposite to the opening of the ion gun 1c, the deposits D, which cause a short circuit between the anode 11 and the cathode 12, can be easily discharged by injecting the injection gas from the opening of the ion gun 1c. In addition, by providing the discharge port 19 at a position between the cathode 13 and the anode 11 that is positioned on the opening side of the ion gun 1c, the deposits D attached to the acceleration electrode 14 can be easily discharged. At least one discharge port 19 may be provided.

In the present embodiment, preferably, an airtight seal capable of opening and closing is provided in the discharge port 19. Thus, it possible to maintain the inside of the ion gun 1b and the inside of the sample chamber 17 in a vacuum state except when the deposits D are discharged.

In addition, by bringing suction means into contact with the discharge port 19, the deposits D may be sucked from the discharge port 19 and discharged.

The discharge port 19 for the deposits D is not an essential component of the present invention.

Fifth Embodiment

In the present embodiment, a target for coating is provided on the beam current detection plate.

FIG. 11A is a schematic diagram illustrating a beam current detection plate 21d provided with a conductive target and a nozzle insertion mechanism according to the present embodiment. FIG. 11B is a schematic diagram illustrating beam current detection by using the beam current detection plate 21d provided with the conductive target 27 and the nozzle insertion mechanism according to the present embodiment.

In the beam current detection plate 21d according to the present embodiment, the conductive target 27 such as carbon is provided at a lower portion (tip portion) of the beam current detection plate 21 according to the first embodiment (refer to FIG. 11A). A detection method of the ion beam B is the same as in the first embodiment (refer to FIG. 11B).

In a case of observing a non-conductive sample with a scanning electron microscope (SEM), it is difficult to observe the sample due to charging (charge-up) of the front surface of the sample in many cases. In such a case, a conductive coating is generally performed on the front surface of the sample by using a coating apparatus.

Since the beam current detection plate in the related art requires conductivity and strength with respect to the ion beam, a metal material which is difficult to be sputtered is generally used for the beam current detection plate. In addition, in a case where the beam current detection plate is made of the same material as that of the conductive target, when the beam current detection plate is worn by the coating, it is necessary to replace the entire beam current detection plate. By configuring the beam current detection plate as in the present embodiment, it becomes easier to maintain the ion milling apparatus, and it is also possible to exchange the target according to the sample.

In a case of coating the sample S, the beam current detection plate 21d is moved such that the target 27 is positioned in front of the opening (emission opening) of the ion gun 1. By irradiating the target 27 with the ion beam B, the material of the target 27 is sputtered (refer to FIG. 11C). The sputtered particles are uniformly attached to the front surface of the sample S.

By adjusting a time for irradiation of the ion beam B (sputtering), it is possible to form the conductive coating film C having an arbitrary film thickness, on the front surface of the sample S. Since the coating by sputtering of the ion beam B does not involve heating, thermal damage of the sample S can be reduced as compared with coating by a resistive heating method in the related art.

In addition, preferably, the target 27 is disposed at an angle of approximately 70° with respect to the ion beam B. By disposing the target 27 in this manner, sputtering efficiency is improved. The angle of the target 27 with respect to the ion beam B may be adjusted by tilting the beam current detection plate 21d itself in processing of the shape of the target 27.

By changing the material of the target 27 to a material such as gold, platinum, gold palladium, platinum palladium, tungsten, or the like, coating with different particle sizes can be performed.

The coating may be performed while rotating the sample stand or changing the angle of the target continuously. Thus, it possible to uniformly coat a sample having a rough surface.

Sixth Embodiment

In the present embodiment, two types of different milling processing can be performed with one ion milling apparatus. The sample holding system 3 according to the present embodiment can perform both cross-section milling processing and flat milling processing.

FIG. 12 is a schematic diagram focusing on the sample chamber 5 of the ion milling apparatus 100e according to the present embodiment. The ion gun 1 (not illustrated) and the gas injection nozzle 2 (not illustrated) are present at a side of the sample chamber 5, that is, at a front side of the paper surface.

The sample holding system 3 of the ion milling apparatus 100e according to the present embodiment will be described in detail.

The sample holding member 31 is configured to include a sample stand 32 for fixing the sample S, and a shielding portion 33 for shielding a portion of the sample S fixed on the sample stand 32. The sample stand 32 and the shielding portion 33 may be integrally configured as one body. FIG. 12 illustrates a state where the sample stand 32 and the shielding portion 33 are integrally configured as one body.

The sample holding member 31 may be configured to further include a sample shielding unit 34 configured with a sample stand driving unit (not illustrated) which rotates the sample stand 32 and a shielding portion position adjustment unit (not illustrated) which adjusts a shielding position relationship between the shielding portion 33 and the sample S, and a sample shielding unit fine-movement mechanism 35 that can drive the sample shielding unit 34 in a direction perpendicular to the ion beam B.

The sample holding member installation portion 41 is provided with a rotation body 42 on which the sample holding member 31 (a member which includes the sample shielding unit fine-movement mechanism 35 and holds the sample S) can be mounted. The rotation body 42 functions as a support stand for supporting the sample holding member 31. The sample holding member installation portion 41 is configured to include, for example, a rotation body 42, a gear (not illustrated), and a bearing (not illustrated). A shielding unit fixing portion 43 is provided on a rear surface of the sample shielding unit fine-movement mechanism 35.

A method of mounting the sample shielding unit fine-movement mechanism 35 on the sample holding member installation portion 41 is performed by bringing a fixing surface (rear surface) of the sample shielding unit fine-movement mechanism 35 into contact with an upper surface of the rotation body 42 of the sample holding member installation portion 41, and screw-fixing the sample shielding unit fine-movement mechanism 35 onto the sample holding member installation portion 41 by the shielding unit fixing portion 43. The whole sample holding member installation portion 41 is not rotated and tilted. The sample holding member installation portion 41 is configured so as to be capable of rotation and tilt at an arbitrary angle with respect to the optical axis of the ion beam B irradiated from the side surface direction of the sample chamber 5, by the rotation body 42 mounted on the sample holding member installation portion 41. A rotation and tilt direction and a tilt angle of the sample holding member installation portion 41 are controlled by the sample holding member driving unit (not illustrated).

As the method of rotating and tilting the rotation body 42 by the sample holding member driving unit, an arbitrary method can be used. For example, by rotating and tilting the rotation body 42 of the sample holding member installing portion 41 by the sample holding member driving unit provided at the lower portion of the sample holding member installing portion 41, the sample S disposed on the sample shielding unit fine-movement mechanism 35 can be set at a predetermined angle with respect to the optical axis of the ion beam B.

Further, by aligning the rotation axis of the rotation body 42 of the sample holding member installation portion 41 with the position of the upper surface of the sample (the lower surface of the shielding portion 33), it is possible to produce a smooth processed surface. Furthermore, the sample shielding unit fine-movement mechanism 35 is configured so as to move in front, rear, right, and left in a direction perpendicular to the optical axis of the ion beam B, that is, in the X direction and the Y direction.

The sample holding member installation portion 41 is disposed on a flange 52 which also serves as a portion of a wall of the sample chamber 5. The flange 52 is configured to be drawn out along a linear guide 53. That is, the sample holding member installation portion 41 is drawn out from the sample chamber 5 along the linear guide 53.

The sample shielding unit fine-movement mechanism 35 including the sample shielding unit 34 is configured so as to be detachably fixed to the sample holding member installation portion 41. The sample holding member installation portion 41 is drawn out from the sample chamber 5, and the sample shielding unit fine-movement mechanism 35 including the sample shielding unit 34 is mounted on the sample holding member installation portion 41. When the sample shielding unit fine-movement mechanism 35, which includes the sample shielding unit 34 and is mounted on the sample holding member installing portion 41, is drawn from the sample chamber 5, the sample shielding unit fine-movement mechanism 35 including the sample shielding unit 34 becomes detachable from the sample holding member installation portion 41.

This attachment and detachment is performed manually or by an appropriate instrument.

A configuration of a main body of the sample shielding unit 34 will be described. In the present embodiment, a structure in which at least the sample stand 32 and a rotation mechanism (not illustrated) of the sample stand, the shielding portion 33, and the shielding portion position adjustment unit (not illustrated) which finely adjusts the shielding position relationship between the shielding portion and the sample are integrally configured as one body, is referred to as a sample shielding unit 34 (main body).

The rotation mechanism (not illustrated) of the sample stand is provided with a sample stand rotating ring and a sample stand rotating screw, and is configured so as to rotate the sample stand 32 in a direction perpendicular to the optical axis of the ion beam B. The sample stand rotating ring is configured so as to be rotated by turning the sample stand rotating screw, and is configured so as to be reversely rotated by an elastic restoring force of an elastic body.

The sample shielding unit 34 includes a mechanism capable of finely adjusting a position and a rotation angle of the shielding portion 33, and can be attached to and detached from the sample shielding unit fine-movement mechanism 35. In the present embodiment, although the sample shielding unit 34 and the sample shielding unit fine-movement mechanism 35 are configured with two components, the sample shielding unit 34 and the sample shielding unit fine-movement mechanism 35 may be configured with one component.

The shielding portion 33 is fixed to a shielding portion holding unit (not illustrated) by a shielding portion fixing screw (not illustrated). The shielding portion holding unit moves along the linear guide 53 by operating a shielding portion fine adjustment mechanism (that is, a shielding position adjustment unit). Thus, the positions of the sample S and the shielding portion 33 are finely adjusted. The sample stand 32 is inserted and fixed to the sample stand rotating ring (not illustrated) from the lower side. The sample S is adhered and fixed to the sample stand 32. The position of the sample stand 32 in a height direction is adjusted by a sample stand position control mechanism (not illustrated), and the sample stand 32 is brought into close contact with the shielding portion 33.

A method of aligning a section of the sample S and the shielding portion 33 in parallel will be described. Position adjustment is performed by turning the sample stand rotating screw (not illustrated), and fine adjustment is performed by using a microscope such that a section of the sample S and a ridge of the shielding portion 33 become parallel. At this time, the shielding portion fine adjustment mechanism (not illustrated) is rotated and set such that the section of the sample S protrudes slightly from the shielding portion 33, for example, by approximately 50 µm.

In the ion milling apparatus 100e according to the present embodiment, the sample holding member installing portion 41 is provided with a rotation function (rotation body 42), and is provided with a tilt mechanism having a tilt axis in a direction perpendicular to the central axis of the ion beam B. Further, the ion milling apparatus 100e according to the present embodiment is provided with an eccentric mechanism that shifts the central axis of the ion beam B and the rotation axis of the sample shielding unit fine-movement mechanism 35 when the tilt angle is 90 degrees from each other.

The ion milling apparatus according to the present embodiment has a rotation function of the sample S. Thus, by arbitrarily determining an incident angle and an eccentric amount of the ion beam B, the ion milling apparatus can perform the cross-section milling (functions as an apparatus that creates a smooth surface by milling the sample S via a mask), and can perform the flat milling (processing of a smooth surface perpendicular to the axis of the ion beam (when the tilt angle of the sample stand holding portion is 90 degrees)).

Here, in the cross-section milling and the flat milling, it is necessary to change a distance between the ion gun 1 and the sample S depending on the performance of the ion gun 1. For this reason, a movable mechanism (not illustrated) for the ion gun 1 or the sample stand 32 is provided in a direction of the central axis of the ion beam B (refer to FIG. 3). Thus, the distance between the ion gun 1 and the sample S when performing the cross-section milling and the flat milling by using the ion gun 1 is determined, and thus the cross-section milling or the flat milling can be recognized depending on the position of the sample stand 32 on which the sample S is mounted or the position of the ion gun 1. Therefore, the ion milling apparatus according to the present embodiment has a function of switching between a cross-section milling mode and a flat milling mode (for example, rotation and tilt or rotation).

In the ion milling apparatus 100e according to the present embodiment, on the sample holding member installation portion 41 with a first rotation axis which is present in a plane perpendicular to the central axis of the ion beam B, rotation around a second rotation axis perpendicular to each of the center axis of the ion beam B and the first rotation axis, rotation with the second rotation axis as the tilt center, or swing driving can be performed. That is, in the sample holding system 3 according to the present embodiment, swing driving in the cross-section milling, and rotation of the sample S or swing driving of the sample S in the flat milling are performed by the sample holding member installation portion 41 (rotation mechanism).

In the ion milling apparatus 100e according to the present embodiment illustrated in FIG. 12, the ion gun 1 (not illustrated) is provided on a side of the sample chamber 5 (front side of the paper surface). The reason for this configuration is that the sample holding member installation portion 41 can be stabilized when the sample holding member installation portion 41 (stage 51) is not tilted (for example, in the cross-section milling). In a state where the sample holding member installation portion 41 is not tilted, in order to perform the cross-section processing, it is necessary to irradiate the sample with the ion beam B from the side, and for this reason, the ion gun 1 is provided on the side of the sample chamber 5.

In addition, in accordance with the position of the ion gun 1, a processing observation window 54 for confirming a processed section is provided above the sample chamber 5 (in a gravity environment, a direction opposite to a direction of a gravitational field). According to such a configuration, confirmation of the processed section in the cross-section milling and confirmation of the processed surface in the flat milling can be performed by one processing observation window 54.

A shutter 55 is provided between the processing observation window 54 and the sample S. The shutter 55 is provided so as to prevent the sputtered particles from depositing in the processing observation window 54.

In the ion milling apparatus 100e according to the present embodiment, an optical microscope or an electron microscope for observing the shielding position relationship between the shielding portion 33 and the sample S, may be provided, in addition to the processing observation window 54 which can be vacuum-sealed. The microscope may be exchangeably provided on the opening (processing observation window 54) provided in the sample chamber 5.

Next, an operation method of the ion milling apparatus 100e according to the present embodiment will be described.

The operation unit 62 includes a processing mode setting unit, a sample stand operating condition setting unit, a rotation mechanism operating condition setting unit, and a gas injection condition setting unit.

In the processing mode setting unit provided in the operation unit 62 (operation panel), buttons for selecting the flat milling (Flat) and the cross-section milling (Cross-section) are disposed so as to select either one of the flat milling and the cross-section milling. In addition, in the sample stand operating condition setting unit, buttons for selecting tilt (tilt) and swing (swing) are disposed so as to select either one of tilt and swing. In the sample stand operating condition setting unit, a setting unit, which sets a tilt angle, an angle range (Angle) of swing, and a periodic speed (Speed) in swing, is further provided. Further, in the rotation mechanism operating condition setting section (not illustrated), a setting unit, which sets a swing angle (Angle) and a periodic speed (Speed) in swing by the rotation mechanism, is provided.

Here, the sample stand means the sample holding member driving unit of the sample holding system 3, and the rotation mechanism means the rotation body 42 of the sample holding member installation portion 41 of the sample holding system 3.

The gas injection condition setting unit sets, similarly to the first embodiment, conditions for maintenance of the ion gun 1 by gas injection of the injection gas from the gas injection nozzle 2.

In the cross-section milling processing, while swing driving of the rotation body (rotation mechanism) 42 is required, swing driving of the sample holding member installing portion 41 is not required. Therefore, when the cross-section milling processing is selected (Cross-Section button is selected), the control system 6 of the ion milling apparatus 100e may be configured so as to prohibit or cancel setting by the sample stand operating condition setting unit. When the sample stand 32 is tilted during the cross-section milling, a portion which is not related to an object to be processed is irradiated with the ion beam B, or the section of the sample S is obliquely processed in some cases. For this reason, when the cross-section milling processing is selected, in a case where the sample stand 32 is in a tilt state, a control may be performed so as not to perform irradiation of the ion beam B, or a warning may be performed such that the user is notified of attention. In addition, a control may be performed such that the tilt angle of the sample stand 32 is zero.

In addition, in the flat milling processing, since both of tilt of the sample stand 32 and rotation or swing of the rotation body 42 are used, it is necessary to validate both of input by the sample stand operating condition setting unit (not illustrated) and input by the rotation mechanism operating condition setting unit (not illustrated).

In the ion milling apparatus 100e according to the present embodiment, the rotation body 42 is configured so as to perform both of the swing driving in the cross-section milling and the rotation driving in the flat milling. Thus, it is possible to perform two types of different milling processing by using the one ion milling apparatus 100e.

In the present embodiment, whether to perform the cross-section milling processing or the flat milling processing is selected by processing type selection using a changeover switch provided in the operation unit 62. On the other hand, the present invention is not limited thereto. For example, a sensor for recognizing a shape of the sample holding member 31 may be provided, a signal according to the recognition result may be transmitted to the arithmetic processing unit, and the control unit 61 may select the processing type without depending on the operation by the user.

In addition, in a case where the selection or a state of the apparatus is not appropriate by comparing the processing type selection in the operation unit 62 with the state of the apparatus, the arithmetic processing unit may transmit a warning signal so as to generate a warning for the user. Thus, the user can avoid processing based on erroneous conditions.

In addition, in the cross-section milling and the flat milling, since it is necessary to change the distance between the ion gun and the sample depending on the performance of the ion gun (ion source), the control unit 61 may change the processing type according to the position setting of the sample stand, without depending on the operation by the user. Further, in a case where the position setting of the sample stand and the processing type selection are inconsistent with each other, the control unit 61 may output a predetermined signal so as to output a warning. Even in this case, it is possible to prevent incorrect setting by performing the setting through steps to be described as illustrated in FIG. 12. In addition, the arithmetic processing unit may control the position of the sample stand by selecting the processing type.

Seventh Embodiment

In the present embodiment, confirmation of the sample holding member is added to the ion milling method according to the sixth embodiment, and the control unit 61 confirms whether or not the sample holding member 31 is an appropriate sample holding member corresponding to the processing type.

FIG. 13 is a flowchart illustrating an example in which the operator is prompted to set an accurate apparatus setting by comparing the processing type of the ion milling method according to the present embodiment with the state of the ion milling apparatus.

In the ion milling method according to the present embodiment, the user disposes the sample S to be processed in the sample chamber 5, and then inputs the processing type by using the operation unit 62 (S21).

Here, the control unit 61 determines which processing is selected (S22), and determines whether or not the sample holding member 31 corresponding to the selected processing is provided on the sample holding member installing portion 41 (S23 or S26).

A sensor, which determines a difference between the sample holding member 31 and the sample holding member installing portion 41 and the presence or absence of installation of the sample holding member 31, is provided in the sample chamber 5, and thus whether or not a predetermined sample holding member 31 is provided is determined by the sensor. In a case where the sensor transmits a signal indicating that the sample holding member 31 itself is not provided or that the sample holding member 31 is inappropriate for the set processing type, the control unit 61 transmits a predetermined signal to the display unit 63 via the output unit and outputs a warning (S30). As the warning, for example, a display such as "Err" may be displayed on the display unit 63, or another display means or an alarm generator may be used.

Next, in a case where the user selects the cross-section milling (S22), the control unit 61 determines whether or not the sample holding member 31 is provided (S23). Then, the control unit 61 determines whether or not the tilt angle of the sample stage 51 (sample holding member installation portion 41) is zero (S24). In a case where the tilt angle is not zero, the control unit 61 transmits a predetermined signal to the display unit 63 via the output unit, and outputs a warning. By the output of a warning, it is possible to recognize that the sample holding member 31 is inappropriate for the cross-section milling, and thus it is possible to prevent a situation in which erroneous processing is performed.

After confirming that the tilt angle of the sample stand 32 is appropriately set, the control unit 61 transitions to a state where input of conditions for swing driving of the rotation body 42 is enabled (S25).

In a case where the user selects the flat milling (S22), in order to drive both of the tilt stage 51 and the rotation body 42 (rotation mechanism), the control unit 61 transitions to a state where setting of conditions for the tilt stage 51 and the rotation body 42 is enabled (S27).

Further, the control unit 61 determines that another condition to be set (an ion beam current, a processing time, or the like) is input (S28), and starts processing (S29).

By performing these steps, in the apparatus capable of performing two types of processing, it is possible to easily set processing conditions without an erroneous selection.

Further, in a case where the sample holding member installation portion 41 (stage 51) is tilted (in a case where the tilt angle is an angle other than 0°), the control unit 61 may perform a control such that the sample holding member installation portion 41 (sample holding member driving unit) becomes a non-tilt state.

As described above, the control unit 61 can recognize setting information of the processing type, the type of the mounted sample holding member 31, and the state of the apparatus, and easily determine whether or not the current setting state is appropriate by comparing the information. Therefore, it is possible to prevent processing based on incorrect setting in advance.

Modification Example 1

The present modification example is a modification example in which the beam current detection plate used for inserting the gas injection nozzle is changed from the first embodiment, and the gas injection nozzle is disposed without providing the nozzle insertion port and the gas nozzle port in the beam current detection plate.

In the first embodiment, the gas injection nozzle 2 is inserted into the ion gun 1 by using the gas nozzle port 23 provided in the beam current detection plate 21.

On the other hand, in the present modification example, a tubular member is provided along the side surface of the beam current detection plate, and an end portion of the tubular member is used as a gas nozzle port. In this configuration, the beam current detection plate moves not only up and down in the vertical direction but also right and left in the horizontal direction.

The beam current detection plate may be formed in a laterally long shape, a tubular member may be provided along the side surface of the beam current detection plate, and the end portion of the tubular member may be used as the gas nozzle port. In this configuration, the beam current detection plate moves right and left at least on one axis in the horizontal direction.

In addition, a tubular member may be provided along the back surface of the beam current detection plate, an end portion of the tubular member may be disposed at the lower end of the beam current detection plate, and the end portion of the tubular member may be used as the gas nozzle port. In this configuration, the beam current detection plate moves right and left at least on one axis in the horizontal direction.

Similarly, the beam current detection plate may be formed in a laterally long shape, a tubular member may be provided along the back surface of the beam current detection plate, an end portion of the tubular member may be disposed at the lower end of the beam current detection plate, and the end portion of the tubular member may be used as the gas nozzle port. In this configuration, the beam current detection plate may move not only up and down in the vertical direction but also right and left in the horizontal direction.

A tubular member may be provided by being separated from the beam current detection plate, an end portion of the tubular member may be disposed at the upper end of the beam current detection plate, and the end portion of the tubular member may be used as the gas nozzle port. The gas injection nozzle 2 to which the tubular member is inserted is disposed at the gas nozzle port.

In any case, there is no difference from the first embodiment in the effect in that the deposits can be processed (removed) by injecting injection gas.

Modification Example 2

In the first embodiment, although the sample holding system is not moved during the gas injection, the gas injection nozzle may be directly inserted into the opening (emission opening) of the ion gun by withdrawing the sample holding system from the processing position. In addition, the gas injection nozzle may be inserted from the opening of the ion gun to the inside of the ion gun.

In the present modification example, the gas injection nozzle 2 is preferably made of a material that has appropriate elasticity by which the nozzle can be inserted from the opening of the ion gun into the inside of the ion gun and that is unlikely to be deformed due to external stress. In addition, the gas injection nozzle 2 may be made of a material which is not easily deformed by a weight of the gas injection nozzle or injection of the injection gas. Examples of the material of the gas injection nozzle 2 include, for example, a polyethylene-based resin, a polypropylene-based resin, a fluorine-based resin, and the like.

With this configuration, displacement of the insertion position due to deformation of the gas injection nozzle 2 or the like is unlikely to occur, and the insertion accuracy of the gas injection nozzle 2 is enhanced. Further, it becomes easier to control the gas injection position, and thus it becomes easier to process (remove) the deposit D.

Modification Example 3

In the present modification example, a step of confirming whether or not a short circuit between the electrodes and discharge unstability are solved is included, between the step (S14) of injecting the gas toward the acceleration electrode in the first embodiment and the step (S15) of inserting the gas injection nozzle into the ion gun in the first embodiment.

The control unit 61 monitors a current of the beam B on the detector of the beam current detection region 22 of the beam current detection plate 21 connected to the input unit. When the current flowing through the detector of the beam current detection region 22 is equal to or greater than a predetermined value in a state where the discharge voltage is applied to the ion gun 1, it is determined that the short circuit between the electrodes of the ion gun 1 is solved.

In a case where the current flowing through the acceleration electrode 14 and the acceleration power source 82 is measured by the sensor of the input unit and the measured current value is less than a predetermined current value, and in a case where the current flowing through the cathode 13 and the acceleration power source 82 is measured and the measured current value is less than a predetermined current value, it is determined that the short circuit between the cathode 13 and the acceleration electrode 14 is solved.

Similarly, the control unit 61 monitors a current of the beam B on the detector of the beam current detection region 22 of the beam current detection plate 21 connected to the input unit. In a case where a variation in the current flowing through the detector as the beam current detection region 22 for a predetermined time (for example, five minutes) is less than a predetermined value (for example, less than 5%), the control unit 61 determines that the discharge of the ion gun 1 is stable.

In a case where the current flowing through the acceleration electrode 14 and the acceleration power source 82 is measured by the sensor of the input unit and a variation in the current for a predetermined time (for example, five minutes) is small (for example, 5% or less), and in a case where the current flowing through the cathode 13 and the acceleration power source 82 is measured and a variation in the current for a predetermined time (for example, five minutes) is small (for example, 5% or more), it is determined that the discharge of the ion gun 1 is stable.

In a case where it is determined that the short circuit and the discharge unstability are solved, the control unit 61 restarts the temporarily-stopped processing.

With this configuration, in a case where the deposits attached to the cathode and the acceleration electrode become a cause of maintenance, by injecting the injection gas towards the cathode and the acceleration electrode, it is possible to process (remove) the deposits attached to the cathode and the acceleration electrode, and thus it is possible to shorten a maintenance time. Also, operation efficiency of the ion milling apparatus is improved.

Modification Example 4

In the first embodiment, before performing the ion milling (ion beam processing) of the sample S, maintenance of the ion gun is performed by injecting the injection gas. On the other hand, when the ion milling apparatus is power-on, maintenance of the ion gun may be performed by injecting the injection gas toward the inside of the ion gun by the same procedure. After the ion beam processing is completed, the deposits deposited inside the ion gun may be processed (removed) by injecting the injection gas by the same procedure.

Modification Example 5

In the first embodiment, the gas injection nozzle 2 is inserted into the ion gun 1 by using the beam current detection plate 21. On the other hand, without using the beam current detection plate 21, the gas injection nozzle 2 may be inserted into the inside of the ion gun 1, for example, using a robot arm. Even with this configuration, there is no difference in the effect of the present invention.

Modification Example 6

In the first embodiment, although a case where the processing of the deposits by injection of the injection gas is controlled by the control system 6 is described, the user may perform the processing of the deposits as necessary. In this case, a manual start switch is provided in the operation unit 62. Even with this configuration, there is no difference in the effect of the present invention.

Modification Example 7

The present modification example is a modification example in which the ion gun according to the first embodiment is changed to an ion gun of a cold-cathode direct current discharge (glow discharge) type.

The ion gun used in the present modification example is configured to include an anode, a cathode, an insulator that insulates the anode and the cathode, and an ionization chamber.

The ion gun used in the present modification example includes, for example, an ionization chamber with a bottomed cylindrical shape. In the ionization chamber, an anode is provided at the center of the opening as the emission port of the ion beam (on the center axis in the emission direction of the ion beam). In addition, in the ion gun, a cathode, which is provided with an opening as an emission opening of the ion beam at the center thereof, is provided on the central axis in the emission direction of the ion beam. The anode and the cathode are insulated from each other by an insulator.

The ionization chamber supports the anode, the cathode, and the insulator, and includes a gas inlet for a discharge gas (inert gas) such as a rare gas. The anode and the cathode are connected to the power supply system.

The emission of the ion beam is performed as follows.

A high voltage is applied between the anode and cathode in the ionization chamber that are insulated from each other by the insulator. An inert gas is introduced into the ionization chamber so as to obtain a pressure suitable for discharge. Thus, glow discharge occurs between the two electrodes. A part of the ions of the inert gas generated by the glow discharge are emitted from the opening provided in the cathode as a negative electrode, as an ion beam.

Even in the present modification example, as in the first embodiment, it is possible to process the deposits deposited on the electrodes of the ion gun by using the gas injection nozzle, and thus the same effect can be obtained.

Modification Example 8

The present modification example is a modification example in which the ion gun according to the first embodiment is changed to an ion gun of a hot-cathode direct current discharge (arc discharge) type.

The ion gun used in the present modification example is configured to include a plasma generation chamber, an anode, a cathode, a solenoid coil, and an extraction electrode.

The shape of the plasma generation chamber is not limited, and is, for example, a bottomed cylindrical shape. The plasma generation chamber includes an inlet for introducing an inert gas. The cathode is provided at the center of the bottom of the plasma generation chamber (on the central axis in the emission direction of the ion beam). In addition, the anode is provided on the inner surface of the cylinder of the plasma generation chamber.

Preferably, the cathode is, for example, an electrode such as a filament that emits thermal electrons. The cathode may be configured with a plurality of filaments and the like. The extraction electrode has an opening through which the ion beam is emitted. There is no limitation on the number of the opening.

The cathode is connected to an electrode power source such that a minus terminal is positioned on the outside (the side close to an inner wall of the plasma generation chamber), and a predetermined voltage is applied. A positive electrode of the anode is connected to an arc power source, a negative electrode of the anode is connected to a positive electrode of the electrode power source, and an arc voltage is applied.

The emission of the ion beam is performed as follows.

In a state where a current flows from the electrode power source to the cathode and thus thermal electrons are generated, an inert gas is introduced into the plasma generation chamber so as to obtain a pressure suitable for discharge. The arc voltage is applied, and thus arc discharge occurs between the anode and the cathode in the plasma generation chamber. The inert gas molecules strongly collide with thermoelectrons due to the arc discharge, and thus the Inert gas molecules are ionized. In the plasma generation chamber, the inert gas ions, the electrons, and the inert gas are mixed, and plasma with neutral charges as a whole is present. A part of the generated inert gas ions are attracted by the extraction electrode provided in the opening of the plasma generation chamber, and are emitted from the opening of the extraction electrode, as an ion beam.

A cusp magnetic field is formed in the vicinity of the inner wall of the plasma generation chamber by a solenoid coil disposed around the plasma generation chamber. This cusp magnetic field extends a flight distance of the electron, and thus an ionization rate is increased.

When plasma is generated in the entire plasma generation chamber, the flight distance until the electrons from the cathode (thermoelectrons emitted from the filament) reach the anode is increased, and thus the probability in which the electrons collide with the inert gas molecules in the plasma generation chamber is increased. Therefore, it is advantageous in generating high-density plasma.

The extraction electrode (acceleration electrode) may be one in which a large number of apertures (holes) are uniformly provided over substantially the entire surface. Further, a deceleration electrode may be disposed so as to face the acceleration electrode with a predetermined space therebetween, and the apertures (holes) of the deceleration electrode and the acceleration electrode may be aligned with each other.

In addition, both of the acceleration electrode and the deceleration electrode may be slightly curved such that both of the center portions bulge toward the sample chamber.

In addition, a heater may be configured in a ring shape over the substantially entire periphery of the acceleration electrode and the deceleration electrode, and may be attached to both surfaces of each of the acceleration electrode and the deceleration electrode. The peripheral edge portions of the acceleration electrode and the deceleration electrode may be interposed between the heaters.

Even in the present modification example, as in the first embodiment, it is possible to process the deposits deposited on the electrodes of the ion gun by using the gas injection nozzle, and thus the same effect can be obtained.

Modification Example 9

The present modification example is a modification example in which the ion gun according to the first embodiment is changed to a high-frequency-discharge type ion gun.

The ion gun used in the present modification example is configured to include a plasma generation chamber, a plasma expansion chamber, a high frequency coil, and an extraction electrode.

The shape of the plasma generation chamber is not limited, and is, for example, a bottomed cylindrical shape. The plasma generation chamber is made of quartz. The plasma generation chamber is formed by being wound with the high frequency coil. The plasma generation chamber includes an inlet for introducing an inert gas as a discharge gas.

The plasma generation chamber is connected to the plasma expansion chamber. The plasma expansion chamber is formed so as to have a diameter larger than that of the plasma generation chamber. Multi-pole permanent magnets are disposed on outer circumferences of the plasma expansion chamber. The permanent magnets are disposed such that opposite poles are adjacent to each other.

An extraction electrode is disposed between the plasma expansion chamber and the sample chamber. The extraction electrode is made of a conductive material with a disc shape. Preferably, the extraction electrode is made of a high-melting-point material such as molybdenum or tungsten.

The extraction electrode is configured with the acceleration electrode and the deceleration electrode. The acceleration electrode and the deceleration electrode are disposed so as to face each other with a space therebetween, in this order from the plasma expansion chamber to the sample chamber. A distance between the acceleration electrode and the deceleration electrode is, for example, approximately 1.5 mm to 2.0 mm.

A large number of extraction holes through which the ion beam passes may be formed in the acceleration electrode and the deceleration electrode. The extraction holes of the acceleration electrode and the deceleration electrode may have substantially the same diameter, and may have diameters different from each other. The extraction holes of the acceleration electrode and the deceleration electrode are disposed so as to overlap with each other in a plan view, and disposed such that the ion beam is extracted to the sample chamber without loss.

The plasma generation chamber, the plasma expansion chamber, and the sample chamber are evacuated by evacuation means. After performing evacuation, the discharge gas (inert gas) is supplied to the plasma generation chamber.

The high frequency coil is connected to a high frequency power source, and high frequency power is supplied to the high frequency coil. When high frequency power is applied, the discharge gas becomes plasma. The generated plasma expands into the plasma expansion chamber.

The plasma is confined in the plasma expansion chamber by the magnetic field of the permanent magnet, and the flight distance of the ions increases by applying the magnetic field to the discharge region, thereby improving the ionization rate.

The acceleration electrode is connected to the acceleration power source, and a voltage of, for example, 500 V to 2000 V is applied thereto. The deceleration electrode is connected to the deceleration power source, and a voltage of −100 V to −500 V is applied thereto.

In addition, as the extraction electrode, a ground electrode may be provided on the sample side. The ground electrode is grounded, or a voltage of less than −100 V with respect to the ground is applied to the ground electrode. Thereby, the ion beam is stably extracted.

The ions from the plasma expanded into the plasma expansion chamber are extracted to the extraction holes of the acceleration electrode. The attracted ions are emitted through the extraction holes of the acceleration electrode and the deceleration electrode, as the ion beam.

Even in the present modification example, as in the first embodiment, it is possible to process the deposits deposited on the electrodes of the ion gun by using the gas injection nozzle, and thus the same effect can be obtained.

Modification Example 10

The present modification example is a modification example in which the ion gun according to the first embodiment is changed to a microwave-discharge type ion gun.

The ion gun used in the present modification example is configured to include a plasma generation chamber, a plasma expansion chamber, a solenoid coil, a magnet, and acceleration means.

The shape of the plasma generation chamber is not limited, and is, for example, a cylindrical shape. The plasma generation chamber includes an inlet for introducing an inert gas. A microwave transmission window is provided at one end of the plasma generation chamber. Microwaves generated by a microwave generator are introduced into the plasma generation chamber via, for example, a waveguide. The wall surface of the plasma generation chamber is made of, for example, stainless steel.

The plasma expansion chamber is connected to the other end of the plasma generation chamber while maintaining airtightness. A space inside the plasma generation chamber communicates with a space inside the plasma expansion chamber. In addition, the solenoid coil is disposed around the plasma generation chamber. The coil generates a magnetic field parallel to the propagation direction of the microwaves introduced from the transmission window, in the plasma generation chamber.

The shape of the plasma expansion chamber is not limited, and is, for example, a cylindrical shape. A large number of magnets are disposed around the plasma expansion chamber such that magnetic poles of the magnets alternate with each other. An ion extraction electrode is provided in a portion at which the plasma expansion chamber and a processing chamber communicate with each other.

The vacuum evacuation of the sample chamber is performed and the solenoid coil is energized such that the magnetic field in the emission direction of the ion beam in the plasma generation chamber becomes 0.1 T. When introducing a 2.45 GHz microwave while introducing an argon gas into the plasma generation chamber, an argon gas plasma is generated by interaction between the microwave and the magnetic field.

The argon gas plasma generated in the plasma generation chamber passes through the plasma expansion chamber which expands the plasma, and is extracted by the extraction electrode in the plasma expansion chamber that accelerates the ions in the plasma, as an ion beam.

Even in the present modification example, as in the first embodiment, it is possible to process the deposits deposited on the electrodes of the ion gun by using the gas injection nozzle, and thus the same effect can be obtained.

Modification Example 11

The ion guns according to the first embodiment to seventh embodiment may be configured to be replaceable for disassembly and maintenance. In addition, the number of ion guns is not limited to one, and a plurality of ion guns may be provided. Even with this configuration, there is no difference in the effect of the present invention.

Modification Example 12

Regardless of the method of causing discharge of the ion gun, as long as the ion gun is provided with at least one electrode such as the anode, the cathode, the acceleration electrode, or the extraction electrode and has a possibility in that deposits are attached to either electrode by irradiation using the ion beam, the effect of the present invention can be obtained.

As described above, the ion milling apparatus according to the present invention has been described in detail with reference to the preferred embodiments. it is noted that the contents of the present invention are not limited to the above-described embodiment, and it goes without saying that modifications, changes, or the like can be made as appropriate without departing from the spirit of the present invention.

REFERENCE SIGNS LIST

1: ion gun
2: gas injection nozzle
3: sample holding system
5: sample chamber
6: control system
7: vacuum evacuation system
8: power supply system
11: anode
12: cathode
13: cathode
14: acceleration electrode
15: magnet
16: gas inlet
17: ionization chamber
18: nozzle insertion port
19: discharge port
20: discharge region
21: beam current detection plate (shutter)
22: beam current detection region
23: gas nozzle port
24: nozzle fixing jig
25: nozzle insertion port
26 beam current blocking region
27 target
31 sample holding member
32 sample stand
33: shielding portion
34: sample shielding unit
35: sample shielding unit fine-movement mechanism
41: sample holding member installation portion
42: rotation body
43: shielding unit fixing portion
44: sample holding member driving unit
51: sample stage
52: flange
53: linear guide
54: processing observation window
55: shutter
61: control unit
62: operation unit
63: display unit
81: discharge power source
82: acceleration power source
100: ion milling apparatus
B: beam
C: conductive coating film
D: deposit
G: discharge gas
J: injection gas
S: sample

The invention claimed is:
1. An ion milling apparatus comprising:
an ion gun that generates an ion beam;
a sample chamber that can maintain a vacuum state in which irradiation processing by the ion beam generated by the ion gun is performed; and
gas injection means for injecting a gas toward the inside of the ion gun.

2. The ion milling apparatus according to claim 1,
wherein the gas injection means moves attachments attached to the ion gun by injecting the gas to the attachments so as to restart the irradiation of the ion beam or stabilize the irradiation of the ion beam.

3. The ion milling apparatus according to claim 1,
wherein the ion gun includes a gas injection means insertion port for inserting the gas injection means into the inside of the ion gun.

4. The ion milling apparatus according to claim 1,
wherein the gas injection means is provided in the inside of the sample chamber.

5. The ion milling apparatus according to claim 1, further comprising:
an ion beam current detection plate including a gas injection means holding mechanism which holds the gas injection means.

6. The ion milling apparatus according to claim 1, further comprising:
an ion beam current detection plate including a target for coating.

7. An ion milling apparatus comprising:
an ion gun that is configured to include an anode which is disposed in the inside of the ion gun and to which a positive voltage is applied, a cathode which generates ions by generating a potential difference between the anode and the cathode, a magnet which forms a magnetic field in the inside of the ion gun, and a gas supply port which supplies a gas to the inside of the ion gun;
a sample chamber that can maintain a vacuum state in which irradiation processing by an ion beam generated by the ion gun is performed; and
gas injection means for injecting a gas, which is means different from the gas supply port,
wherein the gas injection means moves attachments attached to the ion gun by injecting the gas to the attachments so as to restart the irradiation of the ion beam or stabilize the irradiation of the ion beam.

8. The ion milling apparatus according to claim 7,
wherein a gas injection means insertion port for inserting the gas injection means is provided in the magnet of the ion gun.

9. The ion milling apparatus according to claim 7,
wherein a gas injection means insertion port for inserting the gas injection means is provided in the cathode of the ion gun.

10. The ion milling apparatus according to claim 7,
wherein the gas injection means is provided in the inside of the sample chamber.

11. The ion milling apparatus according to claim 7, further comprising:
an ion beam current detection plate including a gas injection means holding mechanism which holds the gas injection means.

12. The ion milling apparatus according to claim 7, further comprising:
an ion beam current detection plate including a target for coating.

13. An ion milling method comprising:
causing gas injection means included in an ion milling apparatus to move attachments attached to an ion gun by injecting a gas toward the ion gun.

14. The ion milling method according to claim 13,
wherein the gas injection means moves the attachments attached to the ion gun by injecting the gas in a case where discharge of the ion gun is stopped.

15. The ion milling method according to claim 13,
wherein the gas injection means moves the attachments attached to the ion gun by injecting the gas after discharge of the ion gun is completed or before discharge of the ion gun is started.

16. The ion milling method according to claim 13,
wherein the gas injection means is means different from a gas supply port which supplies a gas to the inside of the ion gun.

17. The ion milling method according to claim 13,
wherein the ion milling apparatus includes an ion beam current detection plate including a gas injection means holding mechanism which holds the gas injection means, and
wherein the gas injection means injects the gas by being held by the gas injection means holding mechanism.

18. The ion milling method according to claim 13,
wherein the gas injection means injects the gas by being inserted into the inside of the ion gun from a gas injection means insertion port provided in the ion gun.

19. The ion milling method according to claim 13,
wherein, after stopping high vacuum evacuation means for performing evacuation of a sample chamber and the ion gun, the gas is injected by the gas injection means.

20. The ion milling method according to claim 13,
wherein the ion gun is configured to include an anode which is disposed in the inside of the ion gun and to which a positive voltage is applied, a cathode which generates ions by generating a potential difference between the anode and the cathode, a magnet which forms a magnetic field in the inside of the ion gun, and a gas supply port which supplies the gas to the inside of the ion gun.

21. The ion milling method according to claim 13,
wherein the ion milling apparatus includes an ion beam current detection plate including a target for coating, and
wherein a sample is coated by irradiating the target for coating with an ion beam.

* * * * *